(12) United States Patent
Yoshioka et al.

(10) Patent No.: US 7,902,697 B2
(45) Date of Patent: Mar. 8, 2011

(54) POWER TRANSFER APPARATUS WITH FLUID TRANSFERRING POWER TO FUNCTIONAL MODULES

(75) Inventors: Masahiro Yoshioka, Tokyo (JP); Yoshinori Takagi, Kanagawa (JP); Ryuhei Sakanoue, Tokyo (JP); Yoshihiro Wakita, Tokyo (JP); Yoshiaki Oikawa, Kanagawa (JP); Takashi Tago, Tokyo (JP); Yasushi Tatehira, Kanagawa (JP)

(73) Assignee: Sony Corporation, Tokyo (JP)

( * ) Notice: Subject to any disclaimer, the term of this patent is extended or adjusted under 35 U.S.C. 154(b) by 88 days.

(21) Appl. No.: 12/341,024

(22) Filed: Dec. 22, 2008

(65) Prior Publication Data
US 2009/0179503 A1 Jul. 16, 2009

(30) Foreign Application Priority Data
Jan. 16, 2008 (JP) .................................. 2008-006987

(51) Int. Cl.
*H05K 7/14* (2006.01)
(52) U.S. Cl. ...................... 307/149; 200/61.05; 200/187; 200/188; 200/189; 361/178
(58) Field of Classification Search ............. 200/61.051, 200/187, 188, 189; 361/178
See application file for complete search history.

(56) References Cited

U.S. PATENT DOCUMENTS

| 3,612,794 | A | * | 10/1971 | Winter | 200/61.6 |
|---|---|---|---|---|---|
| 5,144,340 | A | * | 9/1992 | Hotomi et al. | 347/55 |
| 5,288,700 | A | * | 2/1994 | McDowell | 429/111 |
| 7,309,408 | B2 | * | 12/2007 | Benavides | 204/520 |
| 2006/0120879 | A1 | * | 6/2006 | Sugahara | 417/50 |
| 2006/0286596 | A1 | * | 12/2006 | Fukushima | 435/6 |

FOREIGN PATENT DOCUMENTS

JP 5-183292 7/1993

OTHER PUBLICATIONS

U.S. Appl. No. 12/343,903, filed Dec. 24, 2008, Yoshioka, et al.

* cited by examiner

*Primary Examiner* — Jared J Fureman
*Assistant Examiner* — Justen Fauth
(74) *Attorney, Agent, or Firm* — Oblon, Spivak, McClelland, Maier & Neustadt, L.L.P.

(57) ABSTRACT

A power transfer apparatus includes: a casing into which liquid is injected; two metal plates disposed so as to come into contact with the liquid within the casing; and a power source configured to emit a current into the liquid with each of the two metal plates as an electrode; with power being supplied from the power source to a functional module to be mounted within the casing through the liquid such that each of two electrodes comes into contact with the liquid; and with the functional module being mounted such that the liquid can flow from one of the two metal plates to the other.

12 Claims, 32 Drawing Sheets

POWER TRANSFER APPARATUS WITH FLUID TRANSFERRING POWER TO FUNCTIONAL MODULES

CROSS REFERENCES TO RELATED APPLICATIONS

The present invention contains subject matter related to Japanese Patent Application JP 2008-006987 filed in the Japanese Patent Office on Jan. 16, 2008, the entire contents of which are incorporated herein by reference.

BACKGROUND OF THE INVENTION

1. Field of the Invention

The present invention relates to a power transfer apparatus and functional module, and specifically relates to a power transfer apparatus and functional module whereby power can be supplied effectively wirelessly with a simple configuration, and also flexibility of apparatus design can be enhanced.

2. Description of the Related Art

There are a great number of different choices regarding forming wireless arrangements (hereinafter referred to as "unwiring") of data communication lines, and there are also various applications, but there are few choices regarding unwiring of power lines.

Heretofore, in a case wherein power is unwired and transmitted/received, available methods are classified roughly into the two of a method employing electromagnetic waves, and a method employing electromagnetic induction.

However, the case employing electromagnetic waves includes a problem wherein it is difficult to increase conversion efficiency. Also, the case employing electromagnetic induction enables conversion efficiency to be increased, but includes a problem wherein conversion efficiency suddenly deteriorates when increasing the distance slightly.

Therefore, an arrangement has been proposed wherein a tank filled with conductive liquid is portioned into two chambers by a printed-circuit board made up of an insulating member, and power supply to electronic components of which the power electrodes are formed on both faces of the printed-circuit board is performed through the conductive liquid within the two chambers of the tank (see Japanese Unexamined Patent Application Publication No. 5-183292).

SUMMARY OF THE INVENTION

However, with the technique of Japanese Unexamined Patent Application Publication No. 5-183292, the conductive liquid has to be separated by the printed-circuit board completely, and accordingly, there is a possibility that restrictions occur upon apparatus design and so forth, leading to increase in costs, and so forth. Also, the conductive liquid is completely separated by the printed-circuit board, which makes it difficult to attach/detach the printed-circuit board.

It has been found desirable to enable power to be supplied effectively wirelessly with a simple configuration, and also enable flexibility of apparatus design to be enhanced.

According to an embodiment of the present invention, a power transfer apparatus includes: a casing into which liquid is injected; two metal plates disposed so as to come into contact with the liquid within the casing; and a power source configured to emit a current into the liquid with each of the two metal plates as an electrode, with power being supplied from the power source to a functional module to be mounted within the casing through the liquid such that each of two electrodes comes into contact with the liquid, and with the functional module being mounted such that the liquid can flow from one of the two metal plates to the other.

The multiple functional modules may be detachably mounted.

The power source may emit a DC current into the liquid.

The power source may emit an AC current into the liquid.

According to the above configuration, liquid is injected into a casing, two metal plates are disposed so as to come into contact with the liquid within the casing, a current is emitted from a power source into the liquid with each of the two metal plates as an electrode, power is supplied from the power source to a functional module to be mounted within the casing through the liquid such that each of two electrodes comes into contact with the liquid, and the functional module is mounted such that the liquid can flow from one of the two metal plates to the other.

According to an embodiment of the present invention, a functional module for receiving power supply from a power transfer apparatus including a casing into which liquid is injected, two metal plates disposed so as to come into contact with the liquid within the casing, and a power source configured to emit a current into the liquid with each of the two metal plates as an electrode, the functional module includes: electrodes disposed on the surface and rear face of a plate-shaped main unit respectively, with the surface area of the main unit being smaller than the cross-sectional area of the casing.

Sealing members may be provided, which cover electrodes disposed on the surface and rear face of the main unit.

The functional module may further include: electric load configured to execute predetermined processing in response to the power supply; and a power conversion circuit configured to supply power to the electric load in a stable manner according to the power consumption of the electric load.

Multiple electrodes may be disposed on each of the surface and rear face of the main unit, with the electric load and the electric conversion circuit being provided, which correspond to each of the multiple electrodes.

The power conversion circuit may include a diode bridge for rectifying a current supplied from the electrodes disposed on the surface and rear face of the main unit.

The electrodes disposed on the surface and rear face of the main unit may have an area corresponding to the volume of the liquid.

According to the above configuration, supply of power is received from the power transfer apparatus, electrodes are disposed on the surface and rear face of a plate-shape main unit respectively, and the surface area of the main unit is configured so as to be smaller than the casing.

According to the present invention, power can be supplied effectively wirelessly with a simple configuration, and also flexibility of apparatus design can be enhanced.

DESCRIPTION OF THE PREFERRED EMBODIMENTS

Figure 1:
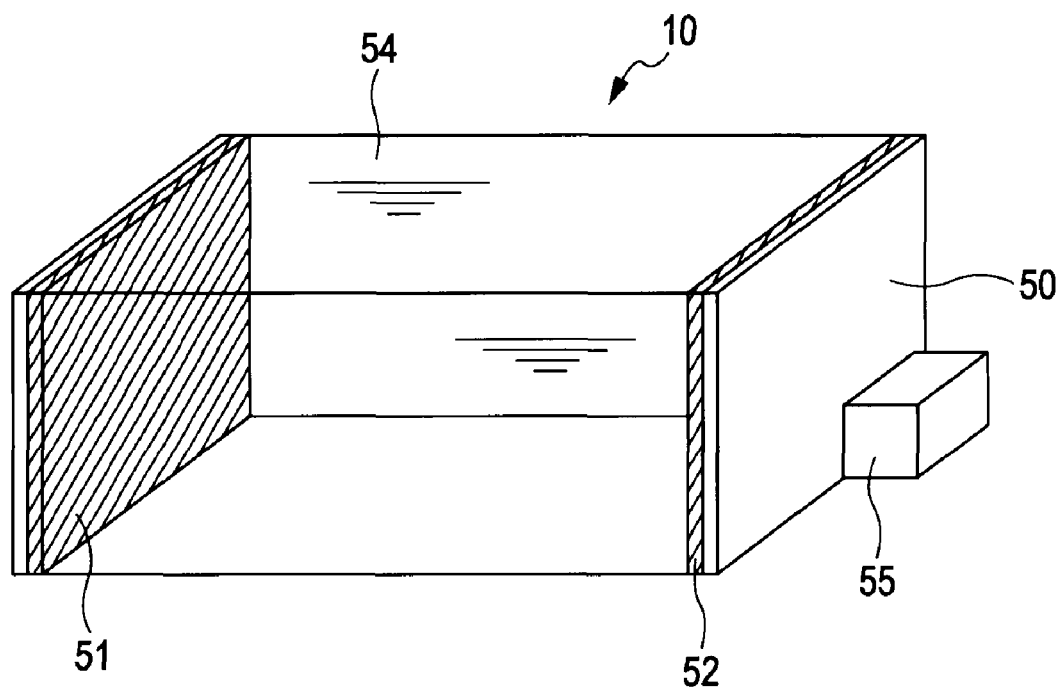
FIG. 1 is a perspective view illustrating a configuration example of a power transfer apparatus according to an embodiment of the present invention.

Before describing an embodiment of the present invention, the correspondence between the features of the claims and the specific elements disclosed in an embodiment of the present invention, with or without reference to drawings, is discussed below. This description is intended to assure that an embodiment supporting the claimed invention is described in this specification. Thus, even if an element in the following embodiment is not described as relating to a certain feature of the present invention, that does not necessarily mean that the element does not relate to that feature of the claims. Conversely, even if an element is described herein as relating to a certain feature of the claims, that does not necessarily mean that the element does not relate to the other features of the claims.

The power transfer apparatus according to an embodiment of the present invention includes: a casing (e.g., casing 50 in FIG. 1) into which liquid (e.g., solution 54 in FIG. 1) is injected; two metal plates (e.g., metal plate 51 and metal plate 52 in FIG. 1) disposed so as to come into contact with the liquid within the casing; and a power source (e.g., power source module 55 in FIG. 1) configured to emit a current into the liquid with each of the two metal plates as an electrode, with power being supplied from the power source to a functional module (e.g., functional module 70 in FIG. 2) to be mounted within the casing through the liquid such that each of two electrodes (e.g., metal plate 71 and metal plate 72 in FIG. 3) comes into contact with the liquid, and with the functional module being mounted such that the liquid can flow from one of the two metal plates to the other.

The functional module according to an embodiment of the present invention for receiving power supply from a power transfer apparatus including a casing (e.g., casing 50 in FIG. 1) into which liquid (e.g., solution 54 in FIG. 1) is injected, two metal plates (e.g., metal plate 51 and metal plate 52 in FIG. 1) disposed so as to come into contact with the liquid within the casing, and a power source (e.g., power source module 55 in FIG. 1) configured to emit a current into the liquid with each of the two metal plates as an electrode, the functional module includes: electrodes (e.g., metal plate 71 and metal plate 72 in FIG. 3) disposed on the surface and rear face of a plate-shaped main unit (e.g., main unit 73 in FIG. 3) respectively, with the surface area of the main unit being smaller than the cross-sectional area of the casing.

With this functional module, sealing members (e.g., sealing members 81 and 82 in FIG. 4) may be provided, which cover electrodes disposed on the surface and rear face of the main unit.

This functional module may further include: electric load (e.g., load 102 in FIG. 8) configured to execute predetermined processing in response to the power supply; and a power conversion circuit (e.g., power conversion circuit 101 in FIG. 8) configured to supply power to the electric load in a stable manner according to the power consumption of the electric load.

Figure 11:
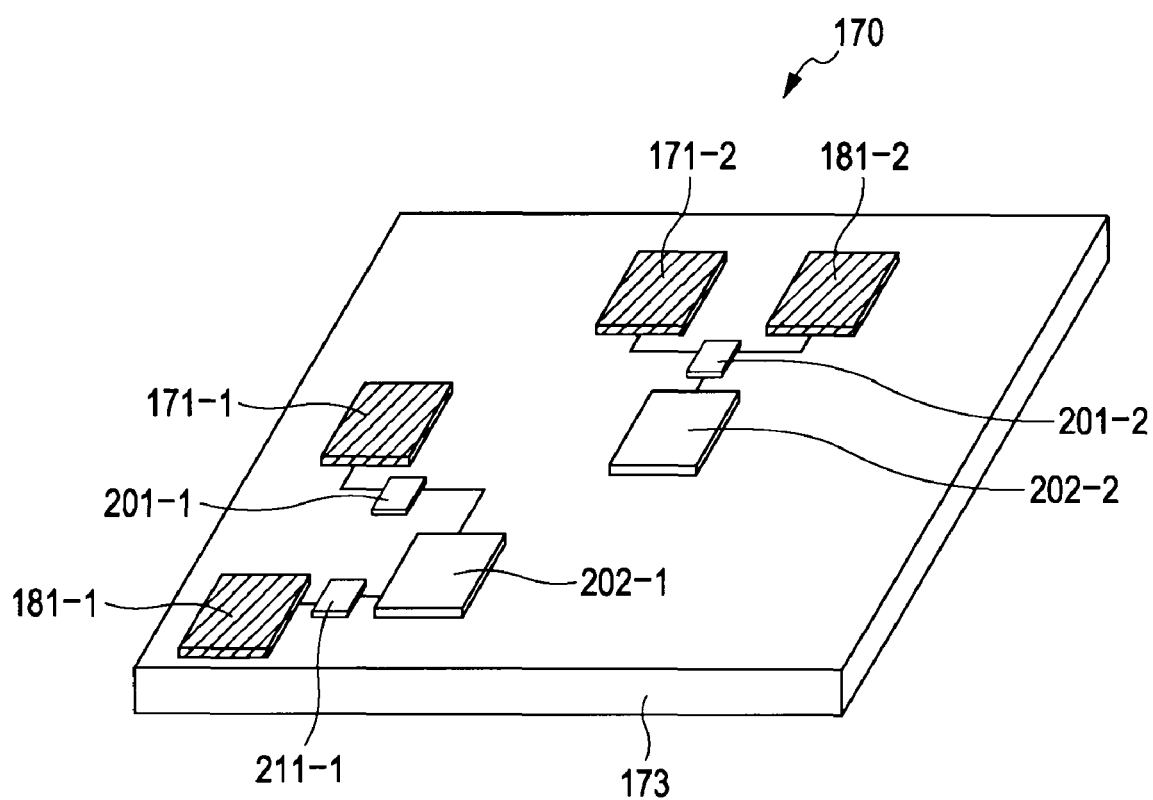
FIG. 11 is a diagram illustrating yet another configuration example of the functional module.

With this functional module, multiple electrodes may be disposed on each of the surface and rear face of the main unit, with the electric load and the electric conversion circuit being provided, which correspond to each of the multiple electrodes (e.g., configured such as shown in FIG. 11).

Figure 10:
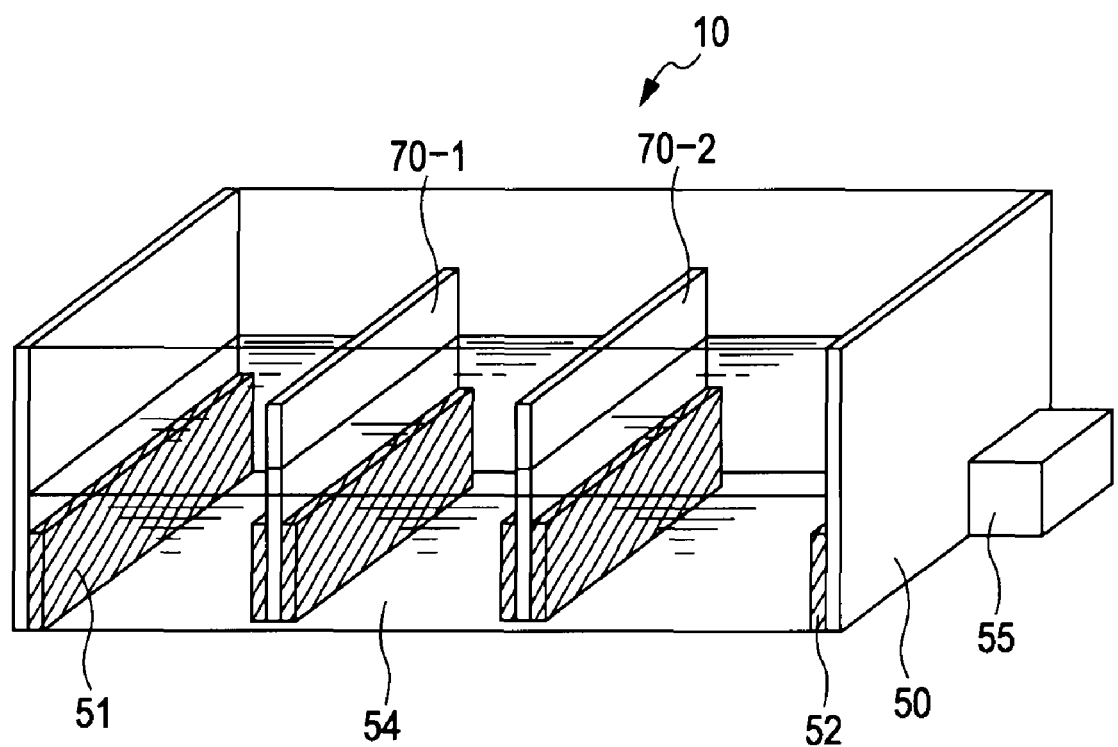
FIG. 10 is a perspective view illustrating another configuration example of the power transfer apparatus.

With this functional module, the electrodes disposed on the surface and rear face of the main unit may have an area corresponding to the volume of the liquid (e.g., configured such as shown in FIG. 10).

Description will be made regarding embodiments of the present invention with reference to the drawings. FIG. 1 is a perspective view illustrating the configuration of a casing 50 of a power transfer apparatus 10 according to an embodiment of the present invention. The casing 50 is, for example, made up of plastic or metal or the like, and space therein is configured so as to be filled with solution 54.

Metal plates 51 and 52 provided in the inner side of the casing 50 are disposed in a state electrically insulated from the casing 50. That is to say, an arrangement is made wherein the metal plates 51 and 52 do not electrically conduct through the casing 50. Note that the metal plates 51 and 52 may be configured as a part of the casing 50.

Also, a power source module 55 connected to the metal plate 51 or 52 is disposed within or outside the casing 50. With the example in FIG. 1, the power source module 55 is disposed outside the casing 50. With the power source module 55, for example, terminals and so forth for supplying power are provided, one of the terminals is connected to the metal plate 51, and the other terminal is connected to the metal plate 52.

The power source module 55 is configured so as to apply a DC current or AC current to the metal plate 51 or 52. Also, with the power source module 55, for example, various types of operating interfaces such as a power button for starting the power transfer apparatus 10, and so forth, as appropriate. Also, for example, a signal processing circuit or the like including a CPU, memory, and so forth, may be included in the power source module 55.

An arrangement is made wherein, of space within the casing 50, functional modules for receiving power supply are disposed in space which is filled with the solution 54, such as described later. That is to say, power generated by the power source module 55 is supplied to the functional modules within the casing 50, and in response to power supply, the functional modules execute predetermined processing.

Note that description has been made here wherein the inside of the casing 50 is filled with the solution 54, but the solution 54 is not restricted in particular, and may be fresh water for example, or another liquid for that matter, as long as the solution 54 is a liquid having electric conductivity.

Figure 2:
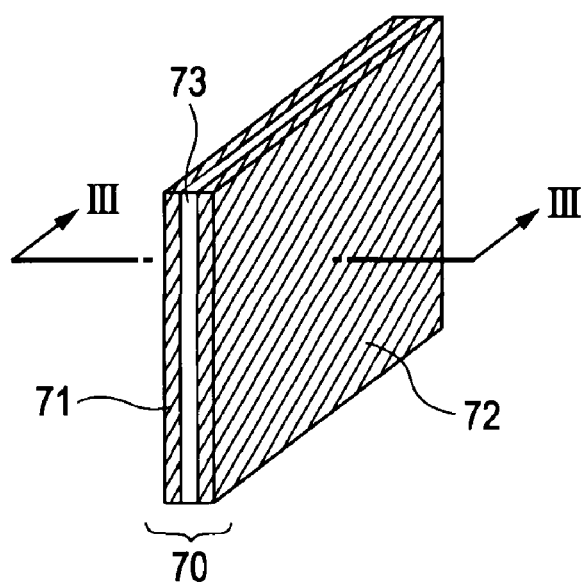
FIG. 2 is a perspective view illustrating a configuration example of a functional module according to an embodiment of the present invention.

FIG. 2 is a perspective view illustrating the configuration of a functional module to be disposed in the space within the casing 50. As shown in the drawing, a functional module 70 is configured so as to sandwich a main unit 73 with metal plates 71 and 72. With the main unit 73, as described later, a power conversion circuit, signal processing LSI, and so forth are disposed, and the power conversion circuit is connected to the metal plates 71 and 72.

Figure 3:
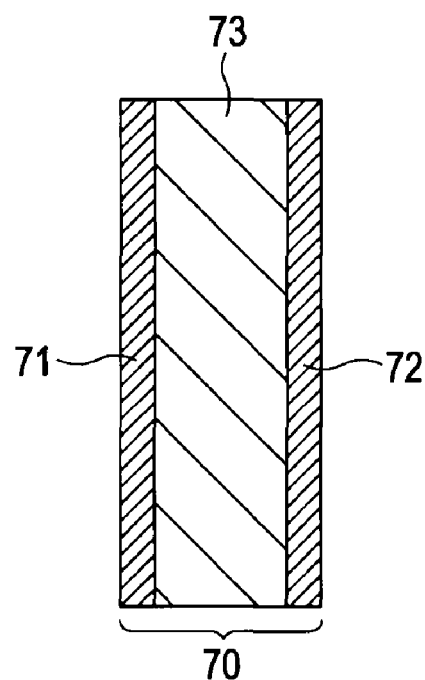
FIG. 3 is a cross-sectional view of the functional module in FIG. 2.

FIG. 3 is a cross-sectional view of the functional module 70 taken along plane III in FIG. 2. As shown in the drawing, the metal plates 71 and 72 are disposed so as not to come into contact with each other, and are connected to the power conversion circuit and so forth within the main unit 73.

Figure 4:
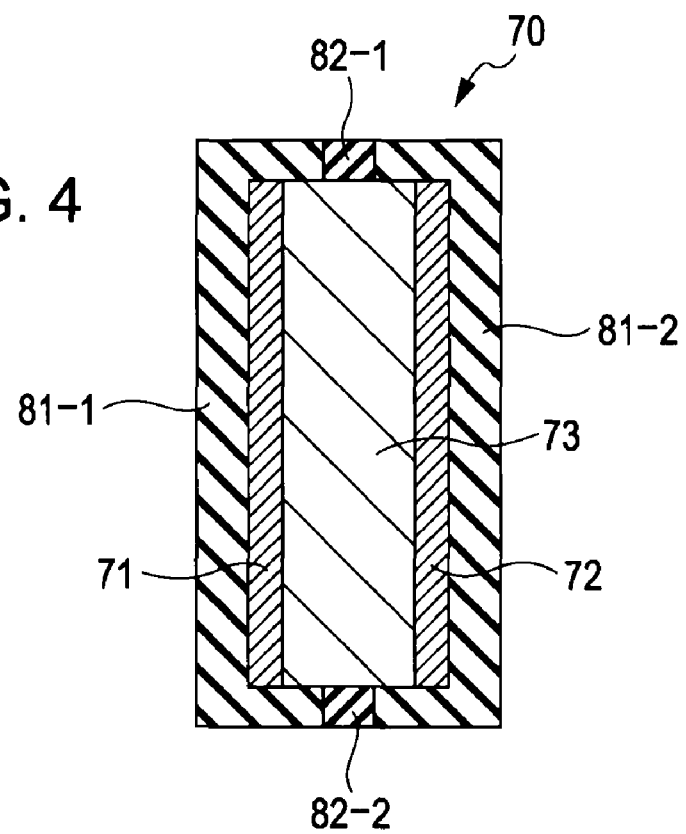
FIG. 4 is a cross-sectional view illustrating another configuration example of the functional module.

FIG. 4 is a cross-sectional view illustrating another configuration example of the functional module 70, and is a cross-sectional view corresponding to FIG. 3. With the example in FIG. 4, a sealing member 81-1 is provided so as to cover the metal plate 71, and a sealing member 81-2 is provided so as to cover the metal plate 72. Also, sealing members 82-1 and 82-2 are provided between the sealing members 81-1 and 81-2, respectively. Here, the sealing members 81-1 and 81-2 are made up of the same material, and the sealing members 82-1 and 82-2 are made up of the same material, and in a case wherein there is no need to particularly distinguish among these, let us simply refer to the sealing member 81 and sealing member 82, respectively.

The sealing members 81 and 82 are provided to prevent the user from electrocution by directly touching the metal plates 71 and 72 in a case wherein a user handles the function module 70 with the hands for example, and are made up of, for example, an insulating material.

For example, an arrangement is made wherein the functional module 70 is covered with only the sealing member 81, there is a possibility that the metal plates 71 and 72 are electrically conducted by a faint current flowing through the sealing member 81, so the sealing members 82-1 and 82-2 are inserted between the sealing members 81-1 and 81-2, respectively. Thus, the metal plates 71 and 72 can be prevented from electrically being conducted by a faint current flowing through the sealing members.

Note that, in order to supply power effectively to the functional module 70, and also prevent the metal plates 71 and 72 from electrically being conducted by a faint current flowing through the sealing members, it is desirable to configure the sealing members 82 and 81 such that the permittivity of the sealing member 81 is generally equal to the permittivity of the solution 54, and the absolute value of the difference between the permittivity of the sealing member 82 and the permittivity of the sealing member 81 is as great a value as possible.

Figure 5:
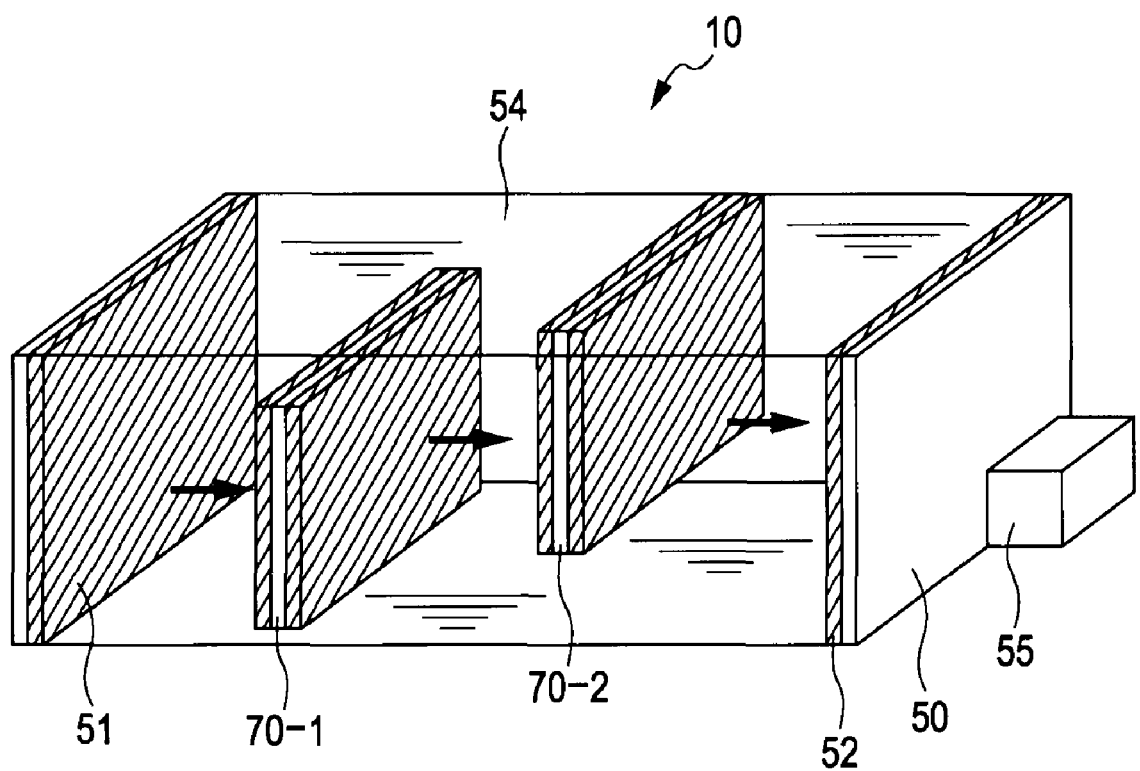
FIG. 5 is a diagram illustrating an example of a case wherein the functional modules are mounted in the power transfer apparatus in FIG. 1.

FIG. 5 is a diagram illustrating an example wherein functional modules are mounted in the power transfer apparatus 10. In the drawing, functional modules 70-1 and 70-2 are mounted in the power transfer apparatus 10. Now, let us say that the functional modules 70-1 and 70-2 are each configured in the same way as the functional module 70 described with reference to FIGS. 2 through 4.

In FIG. 5, the functional module 70-1 is mounted such that one of the cross-sections thereof contacts the cross-section of the front side in the depth direction of the casing 50 in the drawing, and the other cross-section does not contact the cross-section of the rear side in the depth direction of the casing 50 in the drawing. Similarly, the functional module 70-2 is mounted such that one of the cross-sections thereof contacts the cross-section of the rear side in the depth direction of the casing 50 in the drawing, and the other cross-section does not contact the cross-section of the front side in the depth direction of the casing 50 in the drawing.

That is to say, the space within the casing 50 is completely filled with the homogeneous solution 54 without being separated by the functional module 70-1 or 70-2. In other words, even in a state wherein the functional module is mounted, the solution 54 can flow freely from the metal plate 51 to the metal plate 52 within the casing 50.

With the power transfer apparatus 10 according to an embodiment of the present invention thus configured, for example, the size of the casing 50 may be any size as long as the size is enough for the main unit 73 configured in a plate shape, and metal plates 71 and 72, to be immersed in the solution 54 within the casing 50. For example, the functional module 70 might be configured such that the surface area of the main unit 73 (or metal plates 71 and 72) is smaller than the cross-sectional area of the casing 50.

Accordingly, with the power transfer apparatus 10 according to an embodiment of the present invention, flexibility is high, such as the shape of the functional module 70, the shape of the casing 50, and so forth, and accordingly, many different kinds of designs can be employed, and cost can be suppressed. Further, attachment/detachment of the functional module 70 can be readily performed.

Figure 6:
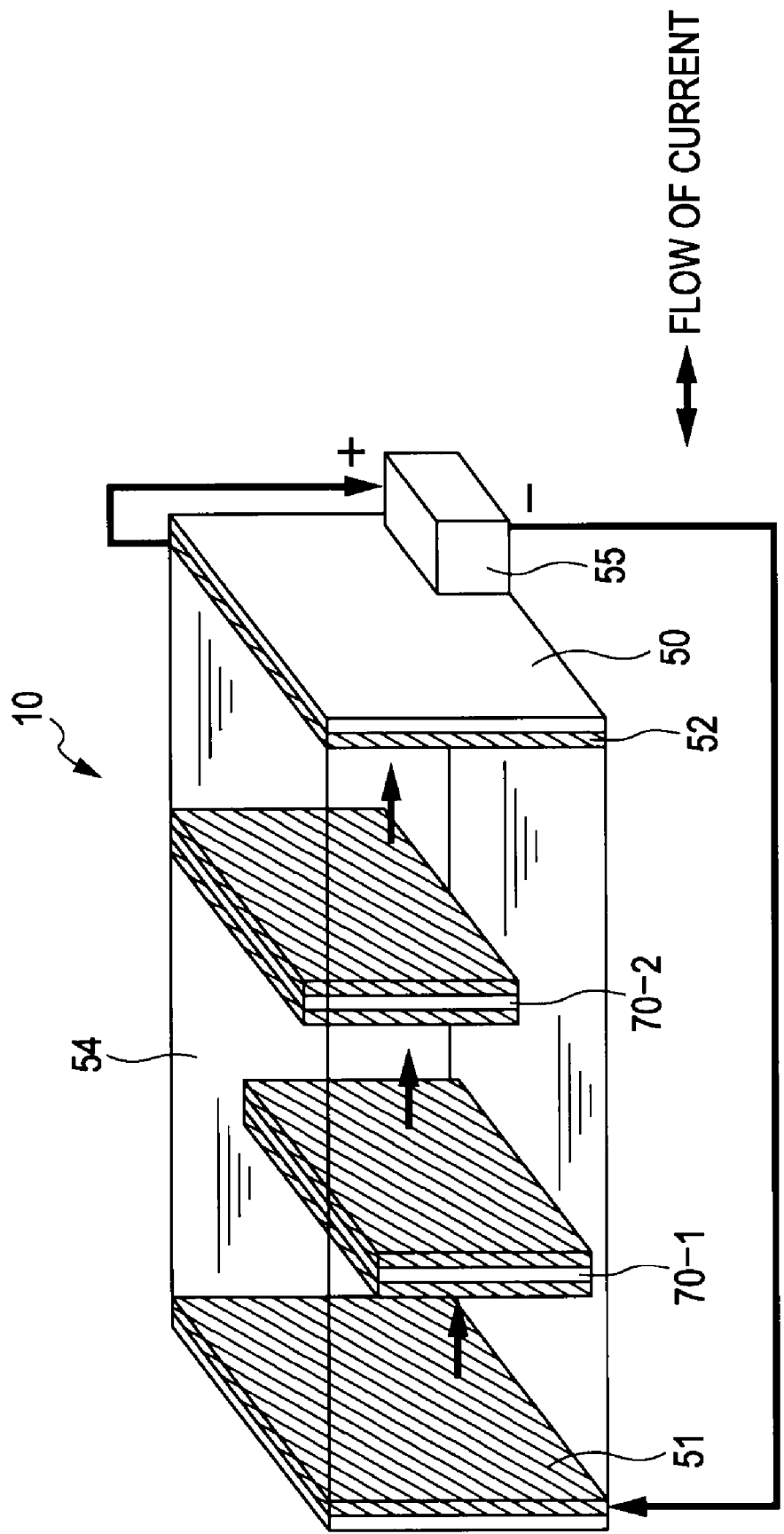
FIG. 6 is a diagram describing a transfer route of the power in FIG. 5.

As shown in FIG. 5, with the power transfer apparatus 10 in which the functional modules are mounted, transfer of power (supply of power to the functional modules) is performed such as shown in FIG. 6. In FIG. 6, the transfer route of power is displayed with arrows in the drawing.

With the example in FIG. 6, let us say that the power source module 55 generates a DC current, the terminal on the "−" side of the power source module 55 is connected to the metal plate 51, and the terminal on the "+" side of the power source module 55 is connected to the metal plate 52.

The DC current supplied from the terminal on the "−" side of the power source module 55 flows from the metal plate 51 to the metal plate 71 (the metal plate on the left side in the drawing) of the functional module 70-1 through the solution 54. Subsequently, the current flows from the metal plate 72 (the metal plate on the right side in the drawing) of the functional module 70-1 to the metal plate 71 (the metal plate on the left side in the drawing) of the functional module 70-2 through the solution 54. Further, the current flows from the metal plate 72 (the metal plate on the right side in the drawing) of the functional module 70-2 to the metal plate 52 through the solution 54, and reaches the terminal on the "+" side of the power source module 55. Let us say that the current mentioned here is the flow of electrons.

As described above, the space within the casing 50 is anywhere filled with the homogeneous solution 54 without separating the solution 54 within the casing 50 by the functional module 70-1 or 70-2, so for example, a faint current may flow directly from the metal plate 51 to the metal plate 71 of the functional module 70 through the solution 54. However, as described later, an LSI or the like of which the resistance value is sufficiently small is provided as load on the functional module 70, so consequently, the resistance value of the electric route from the metal plate 51 to the metal plate 71 of the functional module 70-2 through the solution 54 is greater than the resistance value of the electric route from the metal plate 51 to the metal plate 71 of the functional module 70-1 through the solution 54, and from the metal plate 72 of the functional module 70-1 to the metal plate 71 of the functional module 70-2 through the solution 54.

Accordingly, with the present invention, transfer of power at the power transfer apparatus 10 in which the functional modules are mounted may be performed in order of the metal 51, functional module 70-1, functional module 70-2, and so on, as described with reference to FIG. 6.

Note here that description has been made regarding a case wherein power is supplied with a DC current to the functional module 70, but if an arrangement is made wherein the power source module 55 generates an AC current, power can be supplied with an AC current to the functional module 70.

Figure 7:
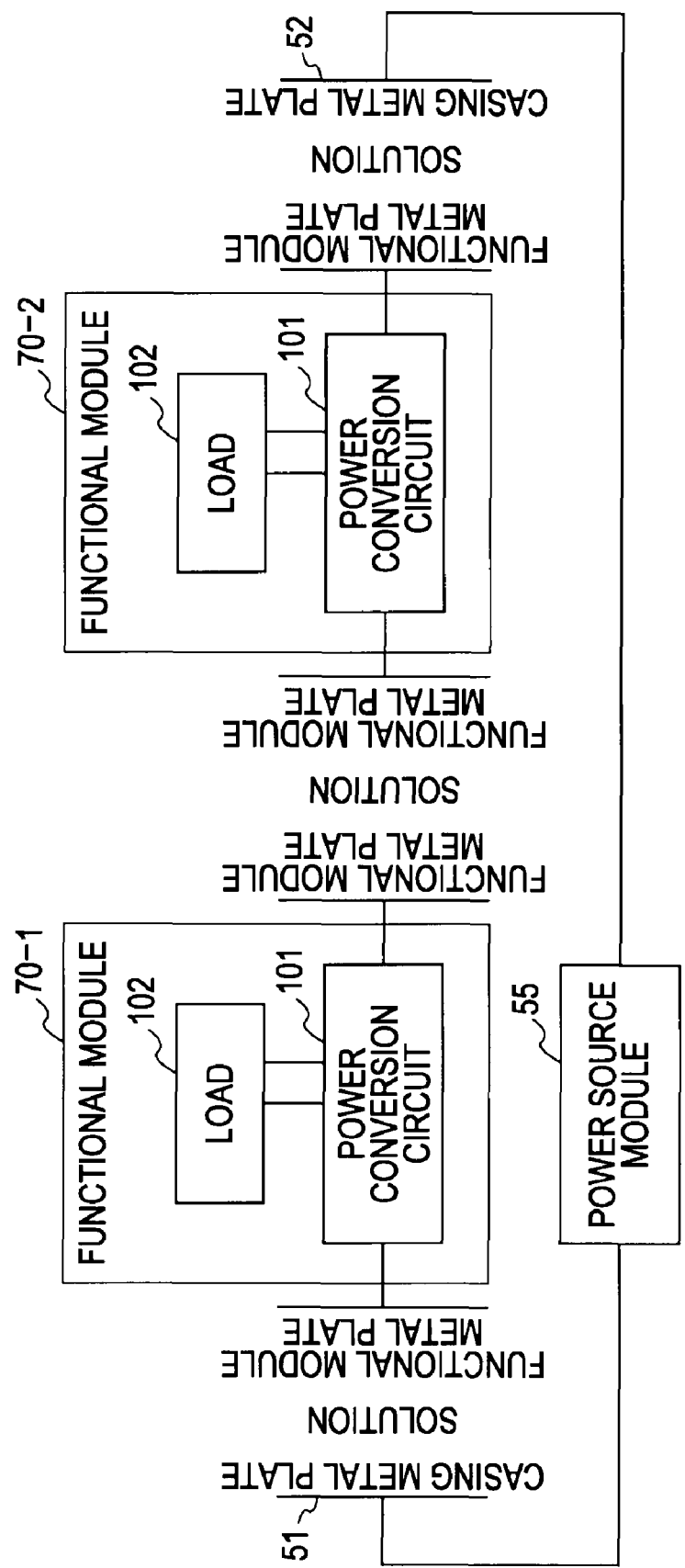
FIG. 7 is a diagram illustrating an example of an equivalent circuit of the power transfer apparatus shown in FIG. 5.

FIG. 7 is a diagram illustrating an example of an equivalent circuit of the power transfer apparatus 10 shown in FIG. 5. As shown in the drawing, the metal plate (metal plate 51 or 52) of the casing, and the metal plate (metal plate 71 or 72) of the functional module are connected through the solution without directly contacting so as to supply power wirelessly. Note that between the metal plates of the functional modules 70-1 and 70-2 are also connected without direct contact so as to supply power wirelessly. In other words, the power supplied from the power source module 55 is transferred through a capacitor made up of the metal plate of the casing, the metal plate of the functional module, and the solution, thereby supplying power wirelessly.

Also, with the example in FIG. 7, a power conversion circuit 101 and load 102 are provided within the functional modules 70-1 and 70-2. The power conversion circuit 101 is a circuit for converting the power supplied from the metal plate 71 into a power level for the load 102, and the load 102 is an electronic circuit, for example, such as an LSI (large-scale integration) or the like for performing various types of signal processing.

That is to say, power is supplied to the functional module 70 by mounting the functional module 70 in the power transfer apparatus 10, whereby various types of signal processing can be executed.

Figure 8:
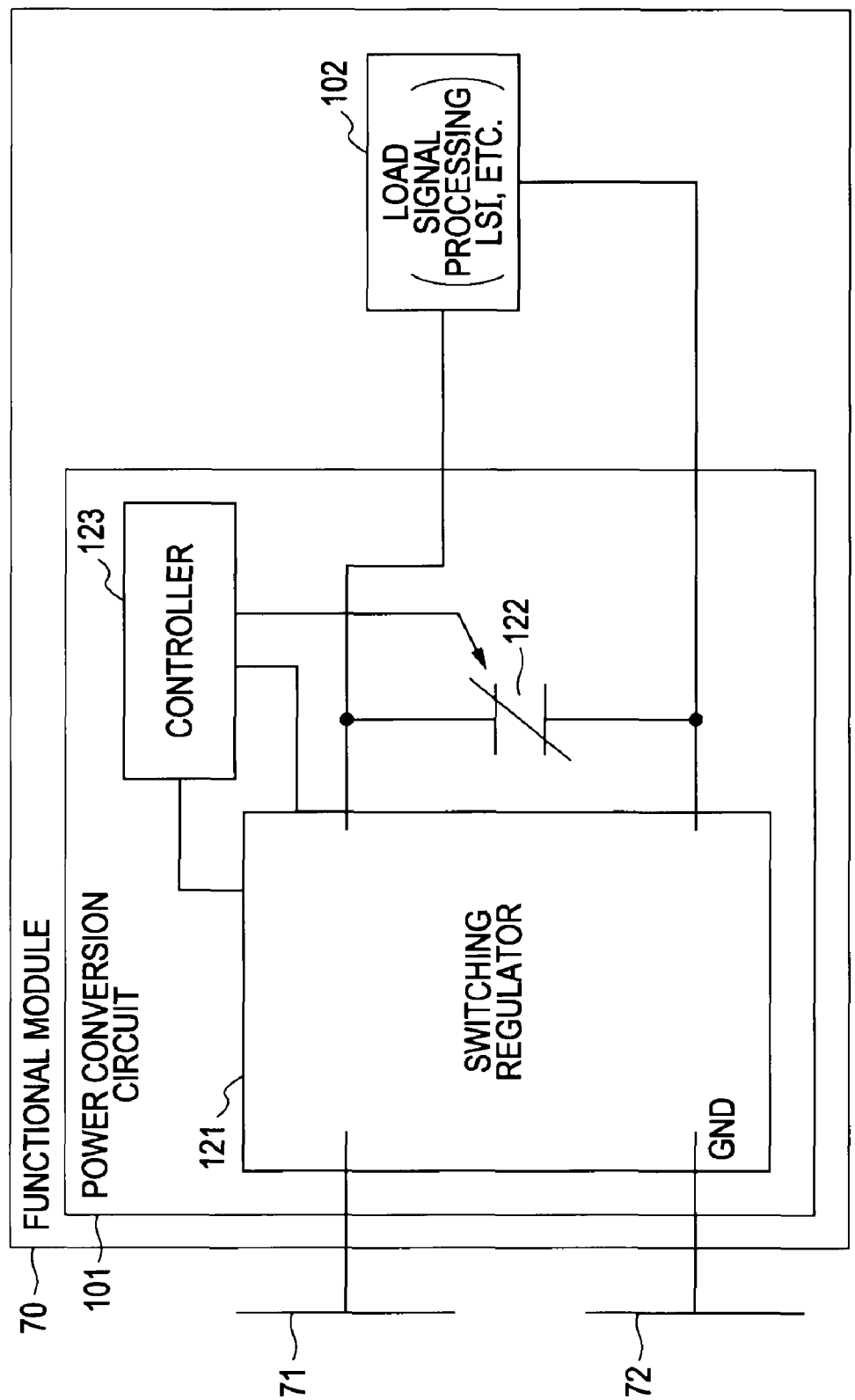
FIG. 8 is a block diagram illustrating a configuration example of the functional module.

FIG. 8 is a block diagram illustrating a configuration example of the functional module 70. The power conversion circuit 101 and load 102 are provided in the main unit 73 of the functional module 70, and the metal plates 71 and 72 are each connected to a switching regulator 121 of the power conversion circuit 101. The power conversion circuit 101 is configured of a controller 123 for adjusting the capacity of a variable-capacity capacitor 122, switching regulator 121 for performing boost/step-down operation, and variable-capacity capacitor 122. The controller 123 adjusts the capacity of the variable-capacity capacitor 122 so as to supply power to the load 102 in a stable manner according to the power consumption of the load 102, and controls the switching regulator 121 so as to suppress occurrence of an abnormal voltage/current level at the metal plates 71 and 72.

The functional module 70 is configured such as shown in FIG. 8, whereby power can be supplied to the load 102 such as a signal processing LSI or the like in a stable manner.

However, in the case of the example in FIG. 8, the functional module 70 has to be mounted in the power transfer apparatus 10 so as to take the polarity of the functional module 70 into consideration. For example, the functional module 70 has to be mounted by finding out whether to direct each of the metal plates 71 and 72 of the functional module 70 in either the left or the right in the drawing of FIG. 5 or 6, otherwise power is supplied to the load 102 in an unstable manner. This is because the polarities of the metal plates 51 and 52 of the casing 50 have to correspond to the polarities of the metal plates 71 and 72 of the functional module 70.

For example, a diode bridge is built onto the functional module 70, whereby power can be supplied to the load 102 in a stable manner without matching the polarities of the metal plates 51 and 52 of the casing 50 with the polarities of the metal plates 71 and 72 of the functional module 70.

Figure 9:
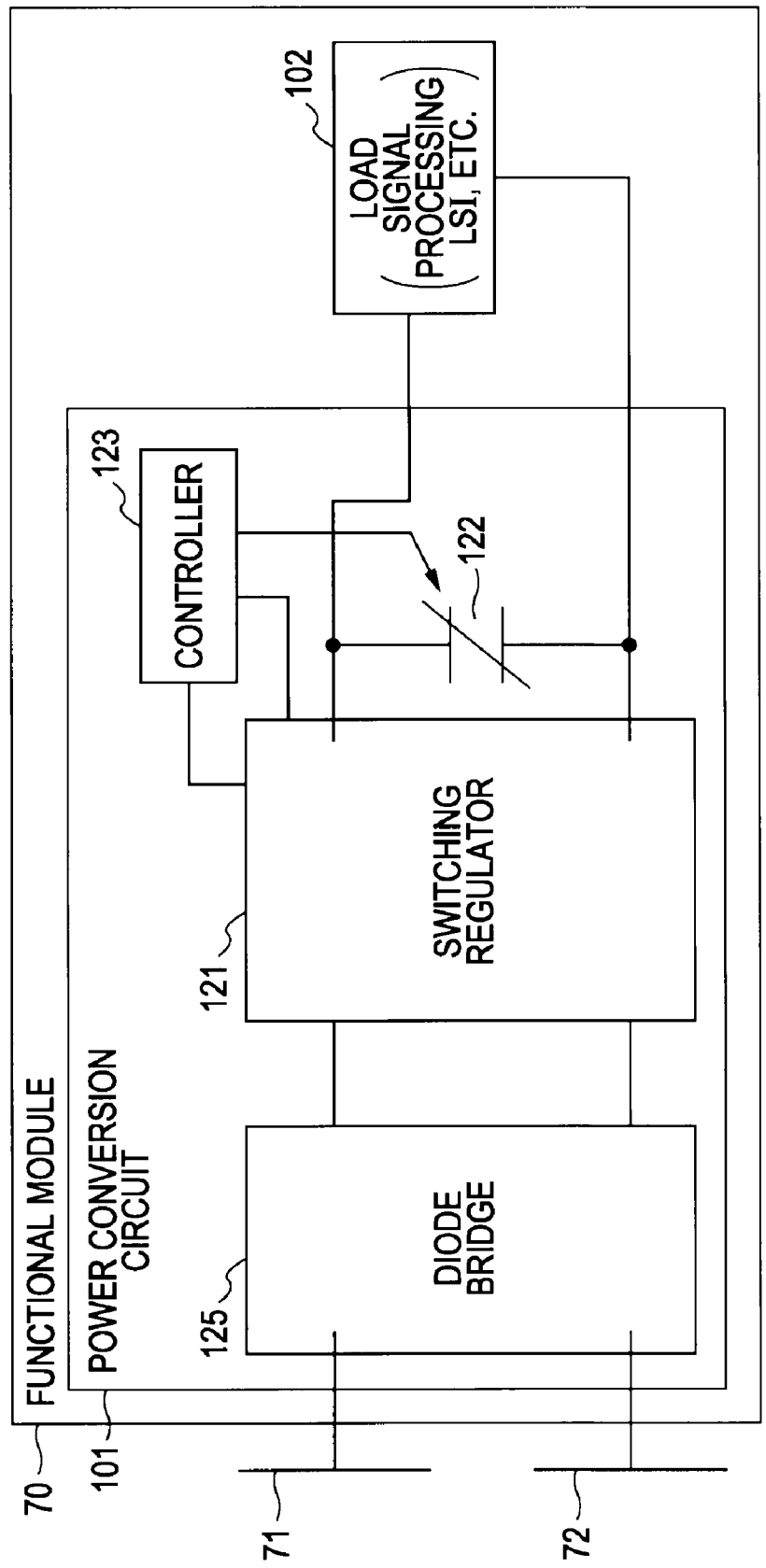
FIG. 9 is a block diagram illustrating another configuration example of the functional module.

FIG. 9 is a block diagram illustrating another configuration example of the functional module 70. With the example in the drawing, a diode bridge 125 is provided in the power conversion circuit 101. The diode bridge 125 rectifies the current supplied from the metal plates 71 and 72 to supply this to the switching regulator 121. The other configurations in FIG. 9 are the same as those in the case of FIG. 8. Rectifying the current by the diode bridge 125 enables power to be supplied to the load 102 without matching the polarities of the meal plates 51 and 52 of the casing 50 with the polarities of the metal plates 71 and 72 of the functional module 70.

The functional module 70 is configured such as shown in FIG. 9, so the functional module 70 does not have to be mounted in the power transfer apparatus 10 taking the polarities of the functional module 70 into consideration. According to such a configuration, for example, even if the functional module 70 is mounted by directing each of the metal plates 71 and 72 of the functional module 70 to either the left or the right in FIG. 5 or 6, power can be supplied to the load 102 in a stable manner.

FIG. 10 is a perspective view illustrating another configuration of the power transfer apparatus 10. This diagram is a perspective view corresponding to FIG. 5.

With the example in FIG. 10, the inside of the casing 50 is filled with the solution 54 only up to a position showing with hatching in the drawing. That is to say, in the case of the example in FIG. 10, the capacity of the solution 54 is generally a half of the case in FIG. 5. Also, in the case of FIG. 10, each of the areas of the metal plates (metal plates 51 and 52) of the casing 50, and the metal plates (metal plates 71 and 72) of the functional module 70 is a half in the case of FIG. 5. That is to say, in the case of the example in FIG. 10, the capacity of the solution 54 decreases, and the height of the space to be filled with the solution 54 within the casing 50 is changed, and accordingly, even if the height (the length in the vertical direction in the drawing) of the metal plates of the casing 50, and the metal plates of the functional module 70 is reduced as compared to the case in FIG. 5, the transfer efficiency of power is not influenced.

In the event that the power transfer apparatus 10 is configured such as shown in FIG. 10, though the amount of power which can be transferred per time increment is smaller as compared to the case in FIG. 5, for example, reduction in weight of the apparatus, and reduction in manufacturing costs of the apparatus can be realized.

Note that in the case in FIG. 10 as well, similar to the case in FIG. 5, the solution 54 within the casing 50 is homogeneous everywhere without being separated by the functional module 70-1 or 70-2.

Figure 12:
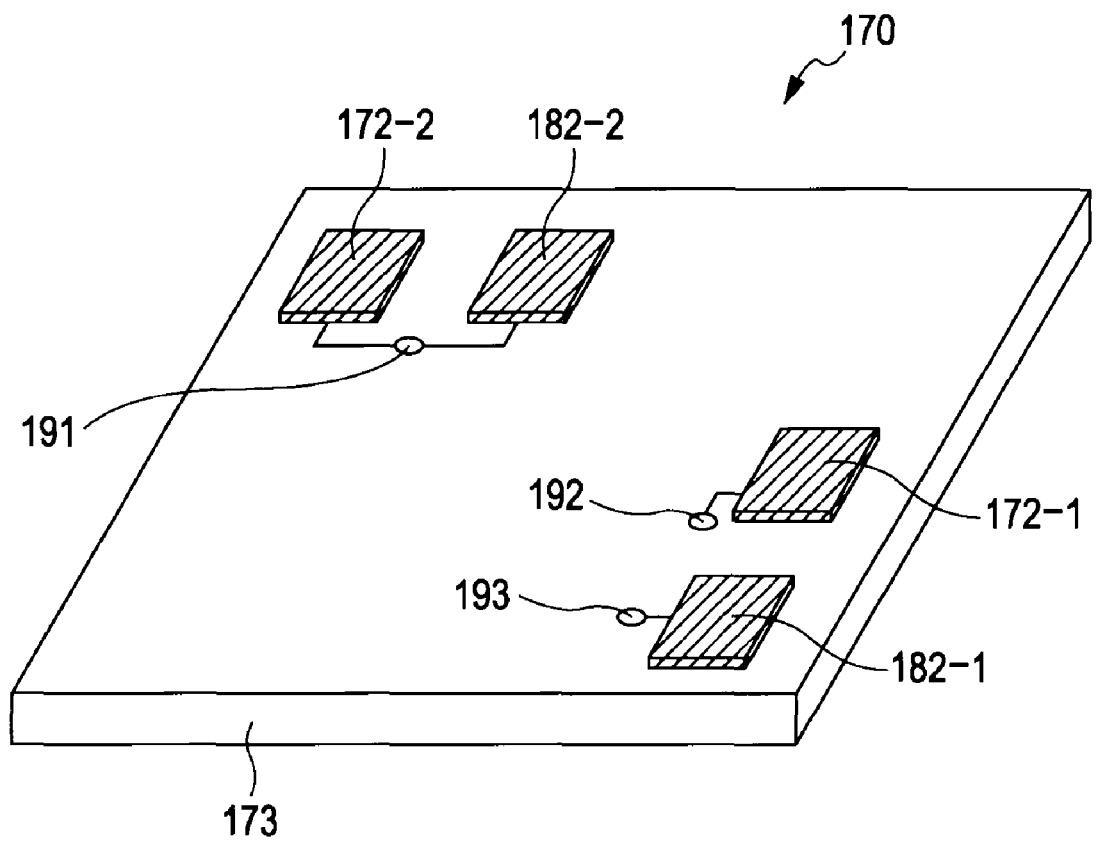
FIG. 12 is a diagram as viewed from the side face of the rear side of the functional module in FIG. 11.

FIGS. 11 and 12 are diagrams illustrating another configuration example of the functional module to be mounted in the power transfer apparatus 10. FIG. 11 is a diagram viewing a functional module 170 from one side face, and FIG. 12 is a diagram viewing the function module 170 from the side face of the rear side of the face illustrated in FIG. 11.

The functional module 170 is different from the case of the functional module 70 in FIG. 2 in that multiple power conversion circuits and multiple signal processing LSIs (load) are provided on a main unit 173. The functional module 170 is different from the case of the functional module 70 in FIG. 2 in that metal plates for covering both faces of the main unit 173 are not provided, and there are provided multiple metal plates of which the areas are smaller than the area of the main unit 173.

As shown in FIG. 11, a metal plate 171-1, metal plate 181-1, metal plate 171-2, and metal plate 181-2 are provided on one side face of the functional module 170. Further, as shown in FIG. 12, a metal plate 172-1 corresponding to the metal plate 171-1, a metal plate 182-1 corresponding to the metal plate 181-1, a metal plate 172-2 corresponding to the metal plate 171-2, and a metal plate 182-2 corresponding to the metal plate 181-2 are provided on the side face of the rear side of the functional module 170.

Also, as shown in FIG. 11, with the functional module 170, a power conversion circuit 201-1 connected to the metal plate 171-1, a power conversion circuit 211-1 connected to the metal plate 181-1, and a power conversion circuit 201-2 connected to the metal plates 171-2 and 181-2 are provided. As shown in FIG. 12, the metal plate 172-1 is connected to the power conversion circuit 201-1 by a via 192, the metal plate 182-1 is connected to the power conversion circuit 211-1 by a via 193, and the metal plates 172-2 and 182-2 are connected to the power conversion circuit 201-2 by a via 191.

Further, as shown in FIG. 11, the power conversion circuits 201-1 and 211-1 supply power to a signal processing LSI 202-1, and the power conversion circuit 201-2 supplies power to a signal processing LSI 202-2.

Now, let us say that the power conversion circuits 201-1, 211-1, and 201-2 are configured in the same way as the power conversion circuit 101 shown in FIG. 8 or 9.

The functional module 170 is also mounted in the power transfer apparatus 10, and receives power supply, in the same way as the case described with reference to FIG. 5, but in the case of the functional module 170 shown in FIGS. 11 and 12, the multiple power conversion circuits and multiple metal plates are disposed in the vicinity of the signal processing LSI, so for example, power for the signal processing LSI 202-1 or power for the signal processing LSI 202-2 can be supplied locally, and consequently, power consumption as the entirety of the functional module 170 can be reduced.

Thus, according to the present invention, power can be supplied without employing electromagnetic waves or electromagnetic induction, so a problem such as marked deterioration in conversion efficiency, or the like is not included, high power can be transferred efficiently. Also, according to the present invention, the functional module 70 is simply disposed within the casing 50 into which the solution 54 is injected, whereby power can be transferred wirelessly, and accordingly, flexibility of apparatus design can be enhanced.

Description has been made so far regarding transfer of power according to the present invention, but signals may also be transferred by the present invention. That is to say, the power transfer apparatus 10 may be employed as an apparatus for transferring power to the functional module 70, and also transferring signals.

Figure 13:
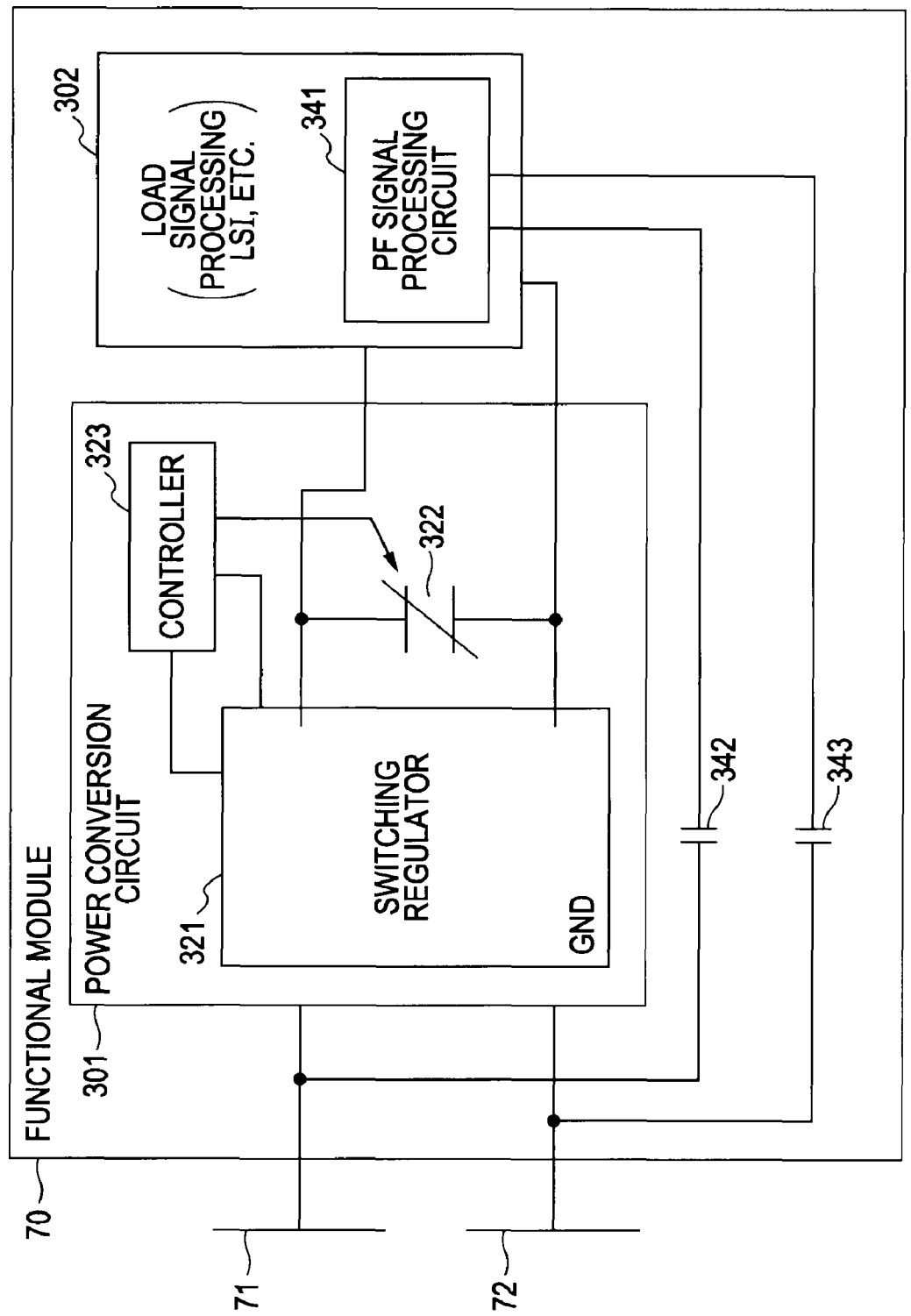
FIG. 13 is a block diagram illustrating yet another configuration example of the functional module.

FIG. 13 is a block diagram illustrating a configuration example of the functional module 70 in the case of transferring signals to the functional module 70. This drawing is a diagram corresponding to FIG. 8, and the same reference numerals are appended to the blocks corresponding to those in FIG. 8.

With the example in FIG. 13, unlike the case of FIG. 8, a RF signal processing circuit 341 is provided as a part of the load 302. The RF signal processing circuit 341 is a functional block for performing wireless communication through the solution 54. Also, with the example in FIG. 13, unlike the case of FIG. 8, there are provided a coupling capacitor 342 for connecting the RF signal processing circuit 341 and metal plate 71, and a coupling capacitor 343 for connecting the RF signal processing circuit 341 and metal plate 72.

In the case of the configuration in FIG. 13, the metal plates 71 and 72 are each employed as conductors for transferring power, and are also each employed as antennas for performing wireless transmission/reception of signals. The coupling capacitors 342 and 343 are provided for superimposing the current flowing to the metal plate 71 or 72 to transfer power, and the current of signals to be transmitted/received through the metal plate 71 or 72.

That is to say, the metal plates 71 and 72 are connected to the power conversion circuit 301, and are also connected to the RF signal processing circuit 341 through the coupling capacitors 342 and 343, respectively.

The configurations of the other portions are the same as those in the case of FIG. 8, so detailed description thereof will be omitted. Note that with the functional module in FIG. 13, similar to the case described with reference to FIG. 9, a diode bridge may be provided in the power conversion circuit 301.

Figure 14:
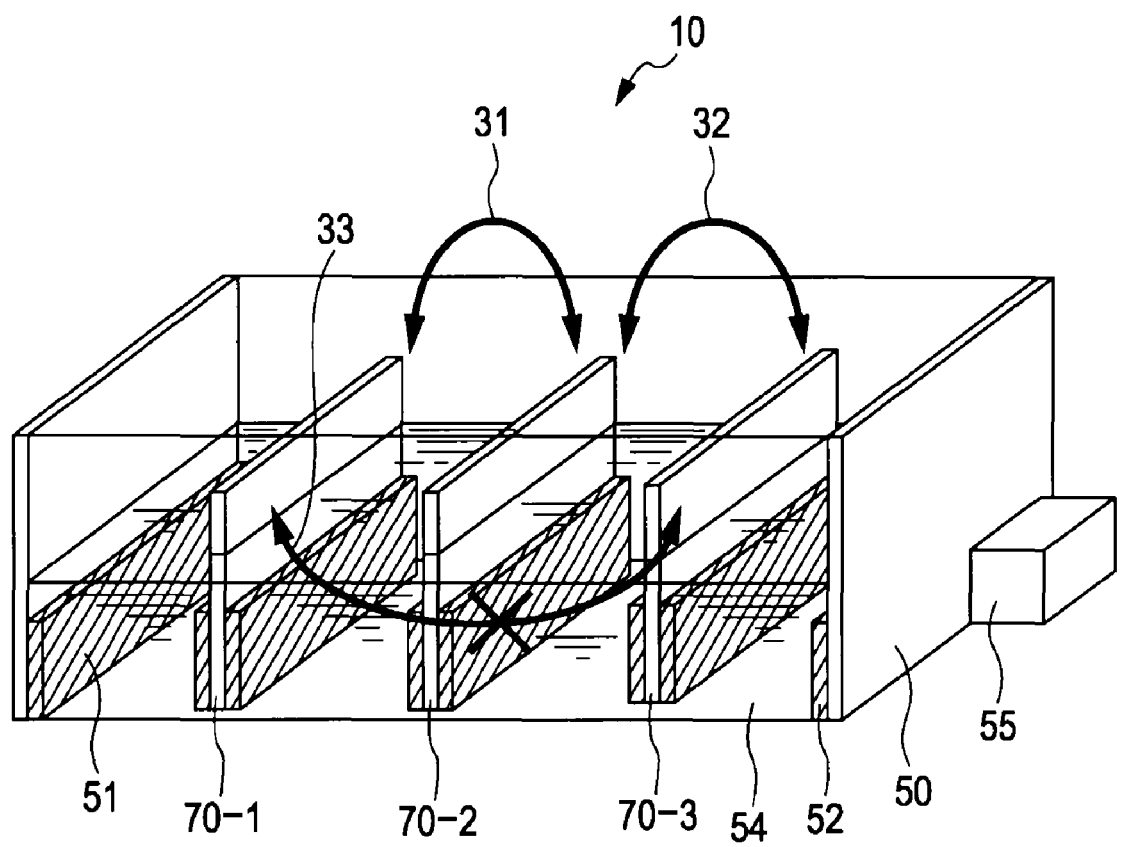
FIG. 14 is a diagram describing a route of communication performed with the functional module in FIG. 13.

FIG. 14 is a diagram illustrating an example of a case wherein the functional modules 70 shown in FIG. 13 are disposed within the casing 50 of the power transfer apparatus 10.

With the example in FIG. 14, the inside of the casing 50 is filled with the solution 54 up to a position illustrated with hatching, and functional modules 70-1 through 70-3 are provided within the casing 50. Note that in the case of FIG. 14 as well, similar to the case in FIG. 10, the solution 54 within the casing 50 is homogeneous anywhere without being separated by the functional module 70-1 through 70-3.

Also, in the case of FIG. 14, signals are transferred to the functional modules 70 by the power transfer apparatus 10, so for example, let us say that a communication processing circuit having the same function as the RF signal processing circuit 341 in FIG. 13 is provided in the power source module 55.

With the power transfer apparatus 10 shown in FIG. 14, in the case of transferring a signal wirelessly, wireless communication with the solution 54 as a medium is performed, with a signal to be transmitted/received between the functional modules 70-1 through 70-3 being transmitted/received to/from the adjacent functional module. Specifically, a signal to be transmitted/received between the functional modules 70-1 through 70-3 is transferred such as shown in an arrow 31 or 32, but is not transferred such as shown in an arrow 33.

As described above, the inside of the casing 50 is not separated by the functional modules 70-1 through 70-3, and is filled with the homogenous solution 54, so for example, a faint current may flow directly from the metal plate of the functional module 70-1 to the metal plate of the functional module 70-3 through the solution 54.

However, an LSI or the like of which the resistance value is sufficiently small is provided as load on each of the functional modules 70-1 through 70-3, so consequently, the resistance value of the electric route from the metal plate of the functional module 70-1 to the metal plate of the functional module 70-3 through the solution 54 is greater than the resistance value of the electric route from the metal plate of the functional module 70-1 to the metal plate of the functional module 70-2 through the solution 54.

Therefore, communication skipping the midway functional module (functional module 70-2 in the case of the example in FIG. 14) is not performed. Also, a signal transmitted (or received) from the metal plate 51 or 52 of the power transfer apparatus 10 is also received (or transmitted) by the functional module 70-1 or 70-3.

Accordingly, with the present invention, transfer of a signal at the power transfer apparatus 10 in which the functional modules are mounted is performed in order, for example, such as the metal plate 51, functional module 70-1, functional module 70-2, and so on, without skipping the functional module on the way.

Thus, with transfer of a signal according to the present invention, a signal is transferred to the functional modules disposed in the nearest in order, whereby interference can be prevented.

Figure 15:
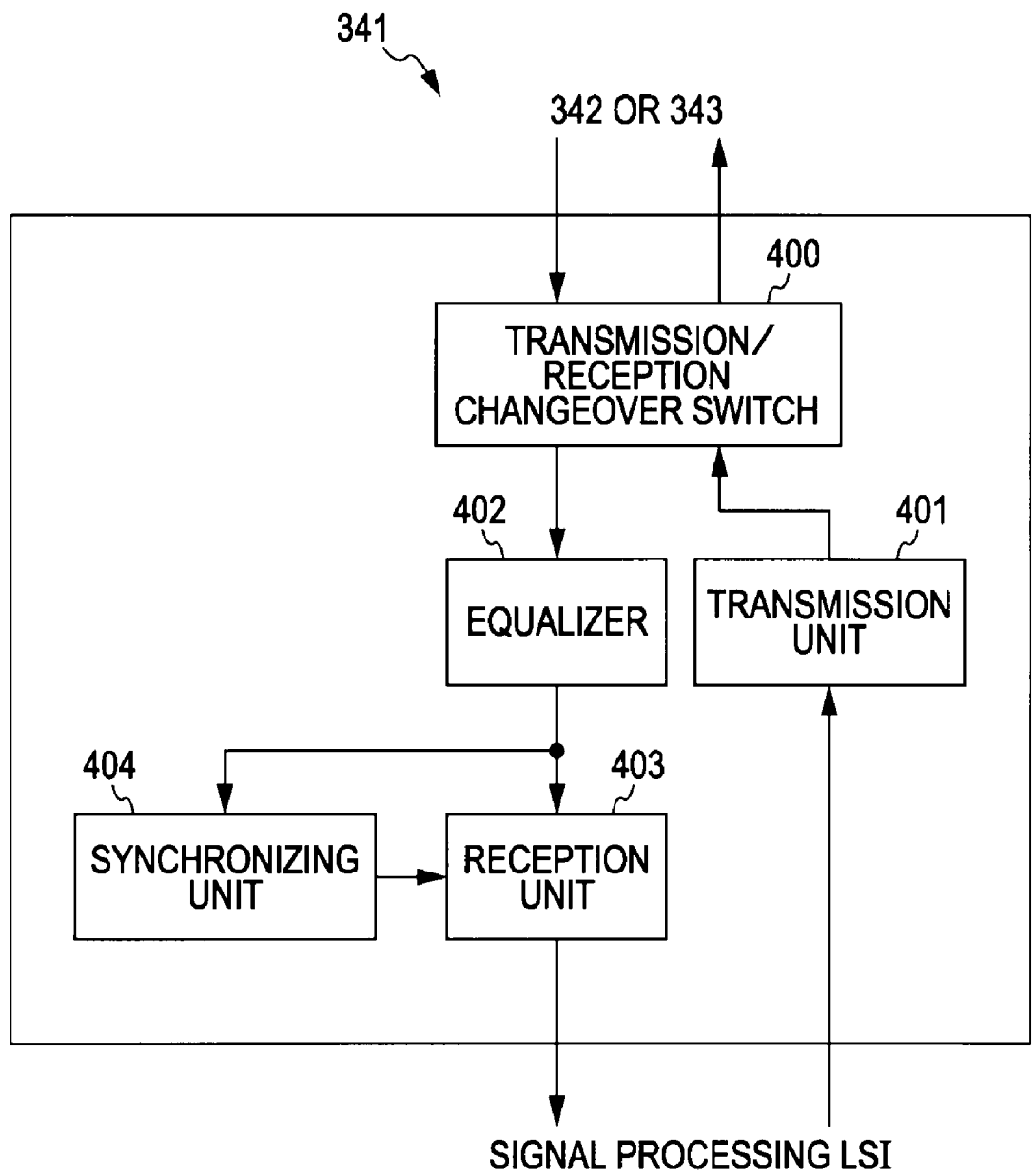
FIG. 15 is a block diagram illustrating a configuration example of the RF signal processing circuit in FIG. 13.

FIG. 15 is a block diagram illustrating the detailed configuration example of the RF signal processing circuit 341 shown in FIG. 13. In the case of the functional module 70 transmitting a signal, a transmission/reception changeover switch 400 shown in the drawing outputs the signal supplied from a transmission unit 401 to the coupling capacitor 342 or 343, and in the case of the functional module 70 receiving a signal, performs switching of the route of transmission/reception of the signal so as to output the signal supplied from the coupling capacitor 342 or 343 to an equalizer 402.

Figure 16:
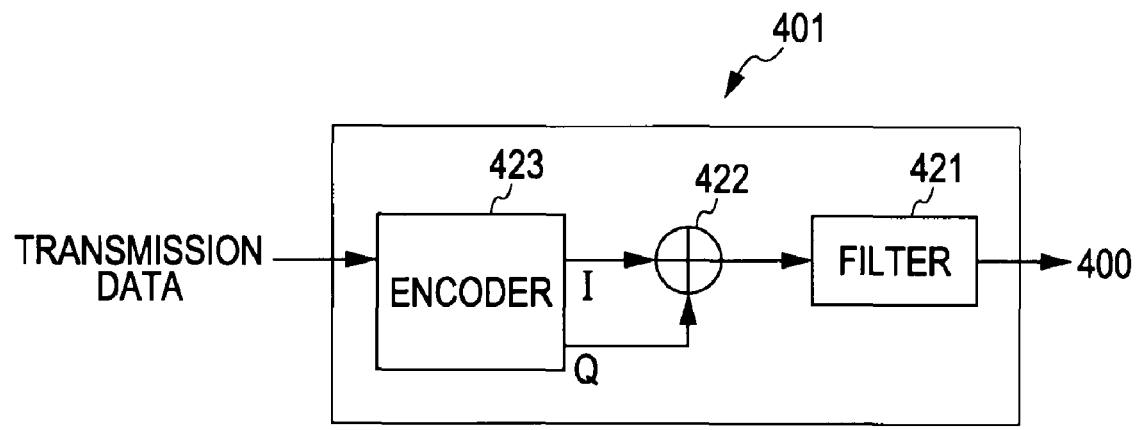
FIG. 16 is a block diagram illustrating a configuration example of the transmission unit in FIG. 15.

The transmission unit 401 in FIG. 15 is configured such as shown in FIG. 16. Specifically, the transmission unit 401 is configured of a filter 421 through encoder 423. The encoder 423 subjects transmission data generated by the signal processing LSI of the load 302 to processing, such as interleave, addition of an error correction code, encoding of code multiple, diffusion encoding, or the like, and then converts this into IQ symbols, and outputs the IQ symbols thereof with phase difference of 90 degrees. For example, the encoder 423 subjects a baseband signal to Manchester encoding, and converts the signal wherein the two bits of the baseband signal are subjected to Manchester encoding, into a single transmission IQ symbol.

Figure 17:
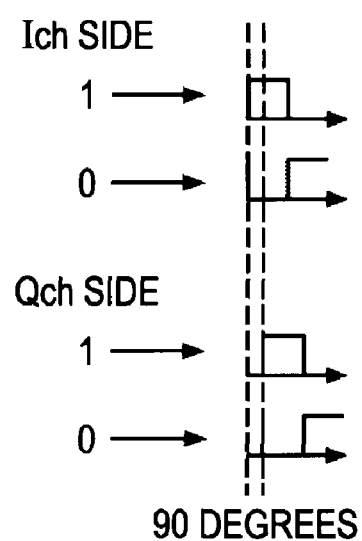
FIG. 17 is a diagram describing the configuration of an IQ symbols.

A signal transmitted as an I signal (or Q signal) is subjected to mapping such as shown in FIG. 17. With the example in FIG. 17, "1" of the baseband signal is subjected to Manchester encoding as a two-bit signal of which the signal level is changed to "H"/"L", and is subjected to mapping to a symbol "1" of an I channel (ch). "0" of the baseband signal is subjected to Manchester encoding as a two-bit signal of which the signal level is changed to "H"/"L", and is subjected to mapping to a symbol "0" of an I channel (ch). Similarly, a two-bit signal is also subjected to mapping to a symbol "1" or symbol "0" of an Q channel, but the signal (Q signal) of the Q channel has a phase difference of 90 degrees as to the I channel (I signal).

Returning to FIG. 16, an adder 422 performs addition of the IQ symbols supplied from the encoder 423. Note that, for example, in the case of performing wireless communication with electromagnetic waves as media, each of the I and Q signals supplied from the encoder 423 has to be subjected to carrier wave mixing, but with the present invention, wireless communication is performed with the solution as a medium, so carrier wave mixing does not have to be performed.

The filter 421 subjects the signal output through the processing of the adder 422 to filtering processing for suppressing harmonic signals, and consequently, the signal output through the processing of the filter 421 is output to the transmission/reception changeover switch 400.

The equalizer 402 in FIG. 15 multiplies the high-frequency components of the signal supplied from the transmission/reception changeover switch 400 by a gain. For example, the equalizer 402 multiplies the transmission line of the signal supplied from the transmission/reception changeover switch 400 by inverse frequency properties, thereby rectifying the digital signal.

Note that, for example, in the case of performing wireless communication with electromagnetic waves as a medium, processing for separating carrier waves from the signal supplied from the transmission/reception changeover switch 400 has to be performed, but with the present invention, wireless communication is performed with the solution as a medium, so separation of carrier waves does not have to be performed.

Figure 18:
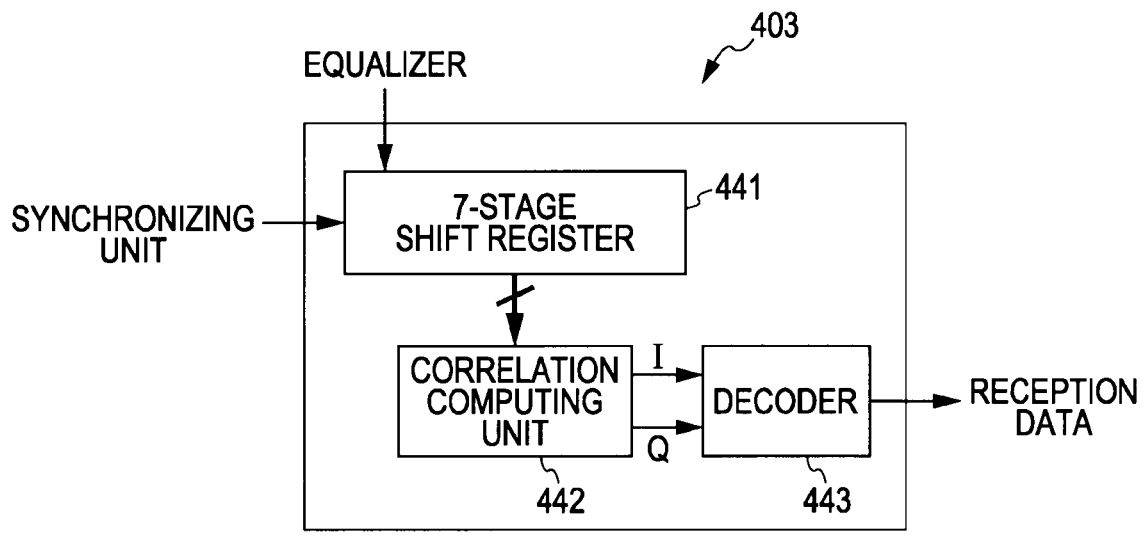
FIG. 18 is a block diagram illustrating a configuration example of the reception unit in FIG. 15.

The reception unit 403 in FIG. 15 is configured such as shown in FIG. 18. Specifically, the reception unit 403 is configured of a 7-stage shift registers 441 through decoder 443.

Figure 19:
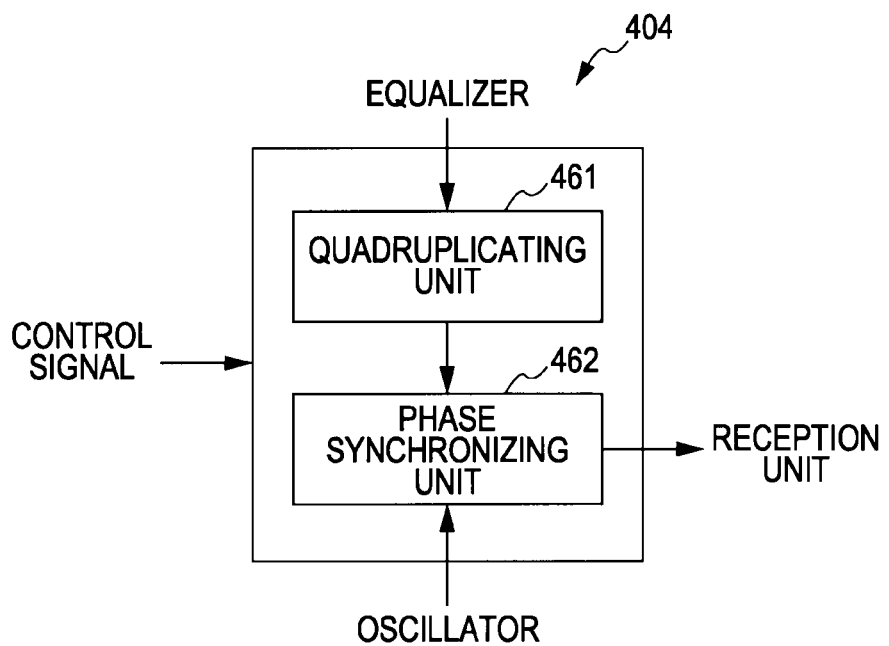
FIG. 19 is a block diagram illustrating a configuration example of the synchronizing unit in FIG. 15.

The synchronizing unit 404 in FIG. 15 is configured such as shown in FIG. 19. Specifically, the synchronizing unit 404 is configured of a quadruplicating unit 461 and phase synchronizing unit 462.

The quadruplicating unit 461 of the synchronizing unit 404 converts the frequency of the digital signal supplied from the equalizer 402 into four times, and outputs this to the phase synchronizing unit 462 through a high-pass filter for blocking the signal of which the frequency is equal to or smaller than a predetermined reference signal. Thus, there is generated a signal of which the amplitude is switched to a "H" or "L" level with a frequency four times the baseband signal. The phase synchronizing unit 462 generates a synchronizing signal by synchronizing the signal having a frequency four times the clock of the baseband signal supplied from an unshown oscillator, with the signal supplied from the quadruplicating unit 461. Note that, for example, the synchronizing unit 404 operates based on a control signal supplied from the signal processing LSI or the like.

Figure 20:
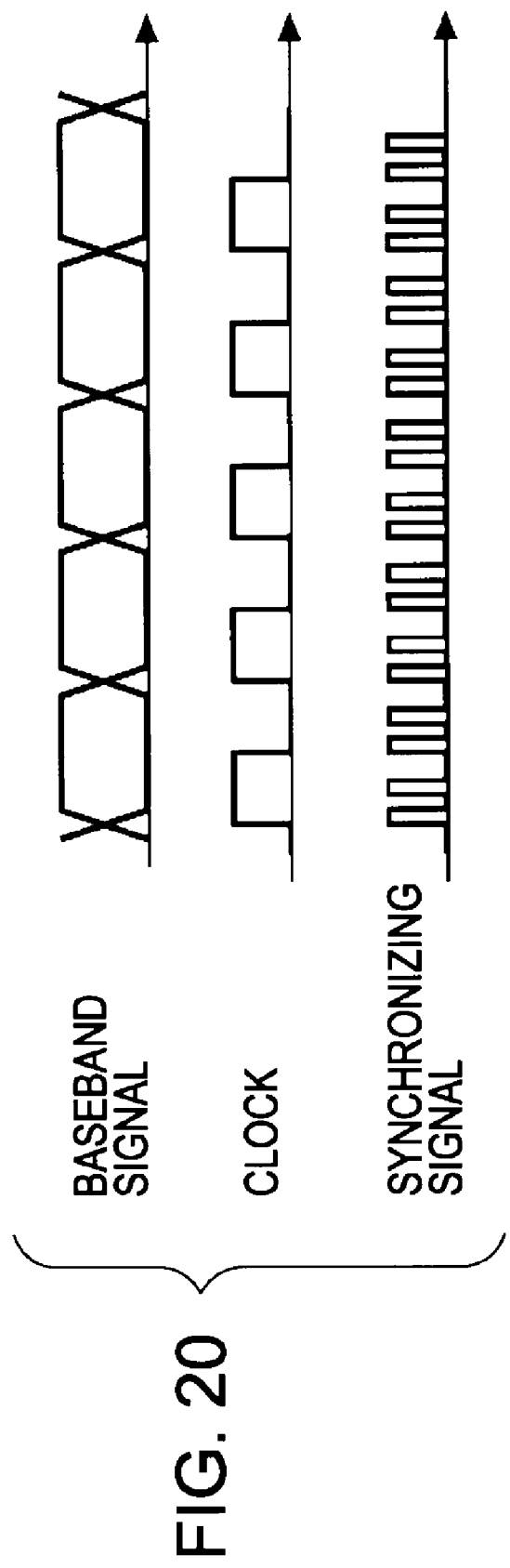
FIG. 20 is a diagram describing a baseband signal, clock signal, and synchronizing signal.

For example, as to the baseband signal such as shown in FIG. 20, a synchronizing signal having a frequency four times the clock of the baseband signal thereof is generated by the synchronizing unit 404.

Note that in FIG. 20, the vertical axis denotes a signal level, the horizontal axis denotes time, and three signals are arrayed and illustrated in the vertical direction in the drawing. FIG. 20 is a diagram for describing the difference between these three signals. Specifically, in FIG. 20, from the top in the drawing, a baseband signal to be transmitted/received (e.g., transmission data generated by the signal processing LSI of the load 302), the clock of the baseband signal, and the synchronizing signal generated by the synchronizing unit 404 are arrayed and illustrated.

The synchronizing signal output from the synchronizing unit 404 is supplied to the 7-stage shift register 441 in FIG. 18. The 7-stage shift register 441 latches seven bits worth of a digital signal supplied from the equalizer 402 based on the synchronizing signal.

The correlation computing unit 442 computes the correlation of the seven bits worth of digital signal latched at the 7-stage shift register 441, determines IQ symbols based on the computation result, and outputs I and Q signals to the decoder 443.

Originally, in order to determine IQ symbols which are information of two bits worth of baseband signal, 8 (2 (bits)×4 (synchronizing signal)) bits worth of shift register has to be employed, but with the present invention, correlation is computed by the correlation computing unit 442, so 7-stage (7-bit) shift register 441 can be employed.

The decoder 443 generates two bits worth of baseband signal based on the I and Q signals supplied from the correlation computing unit 442, and sorts this in serial to output this to the signal processing LSI or the like. Thus, the encoded baseband signal is decoded by the reception unit 403.

Thus, the RF signal processing circuit 341 performs wireless communication which is transmission/reception of an electric signal through the solution 54. Wireless communication is thus performed, whereby interference can be suppressed, as described above. Also, carrier wave mixing, or separation of carrier waves do no have to be performed, whereby manufacturing costs of the apparatus can be suppressed, for example. Further, encoding/decoding processing of data is performed, whereby even if transfer of an electric signal is performed along with transfer of power, the electric signal can be prevented from being distorted and from being unable to be received. As a result thereof, high-precision wireless communication can be realized with a simple configuration.

Figure 21:
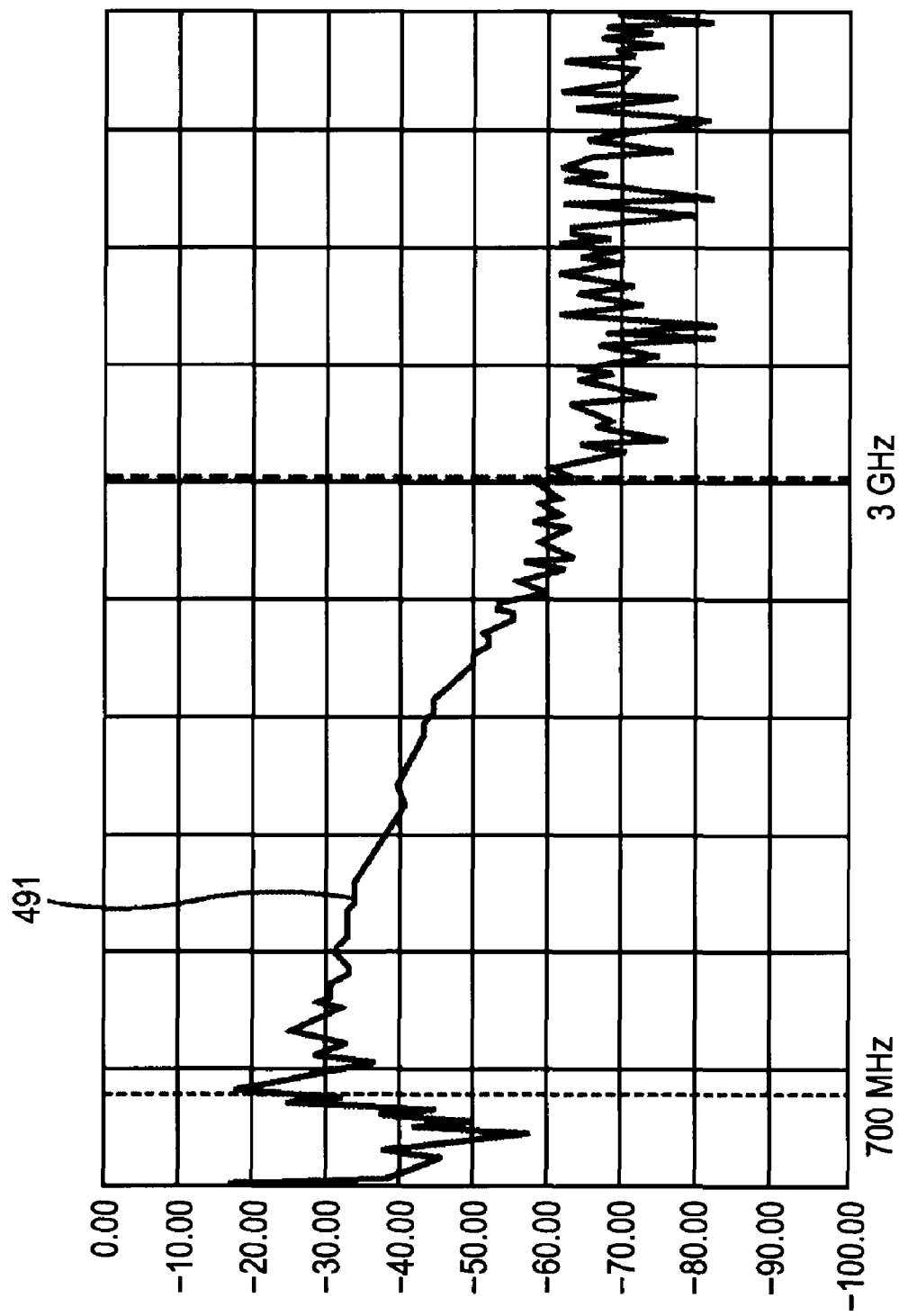
FIG. 21 is a diagram illustrating experimental results obtained by examining the transmission quantity of the signal in the case of transferring a signal to the functional module by the power transfer apparatus according to an embodiment of the present invention.

FIG. 21 illustrates experimental results obtained by examining the transmission quantity of the signal in the case of transferring a signal to the functional module 70 by the power transfer apparatus 10. This drawing is experimental results in a case wherein the horizontal axis denotes frequencies, the vertical axis denotes transmission quantity values (decibel), water is employed as the solution 54, and the two functional modules 70 are disposed with a several-centimeter interval, and transmission quantity values corresponding to change in the frequency of the baseband signal to be transmitted/received are shown in a waveform 491.

In the case of transferring a signal to the functional module 70 by the power transfer apparatus 10 according to an embodiment of the present invention, it is desirable to transmit/receive a signal having a frequency of 700 MHz through 3 GHz corresponding to a gentle sloping portion having no amplitude of the waveform 491. This is because a signal having the above-mentioned frequency band is transmitted/received, whereby transfer of a stable electric signal can be expected.

Figure 22:
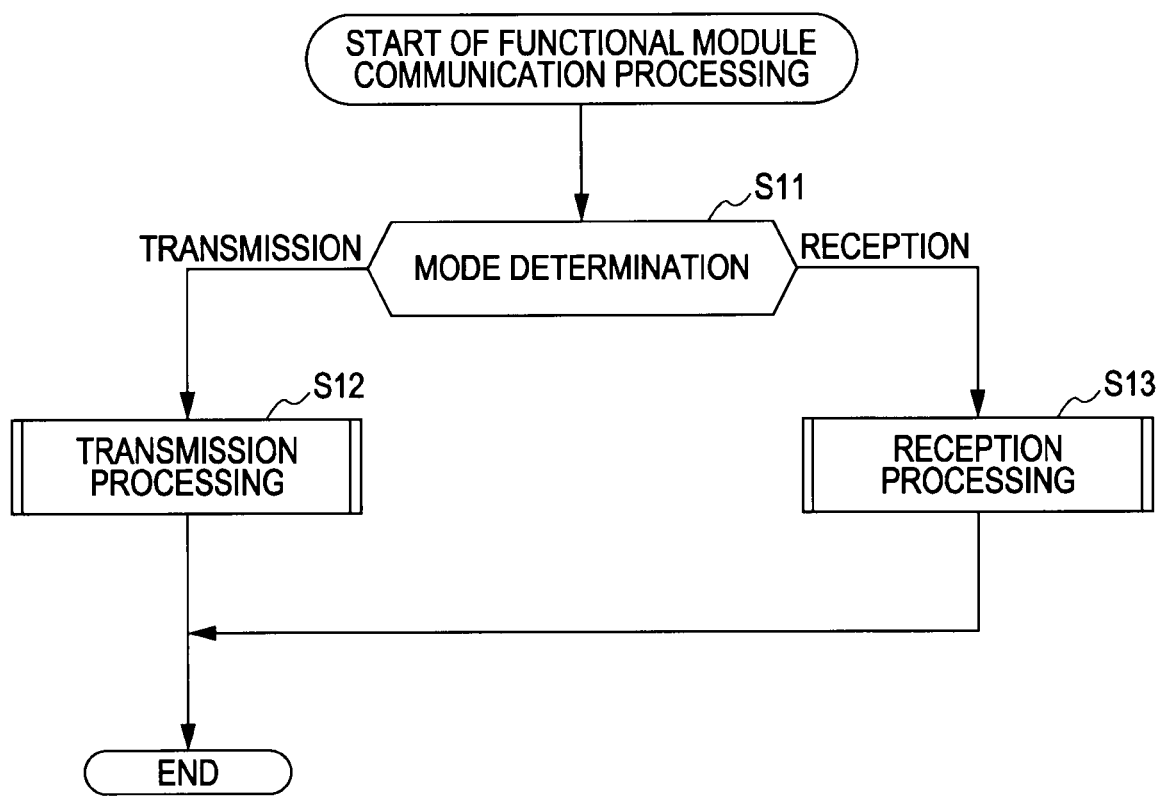
FIG. 22 is a flowchart describing communication processing of the functional module.

Next, description will be made regarding communication processing of the functional module 70, with reference to the flowchart in FIG. 22. This processing is executed when the functional module 70 performs communication with the power source module 55 or another functional module 70.

In step S11, the signal processing LSI of the functional module 70 determines the current mode. Here, determination is made whether the current mode is either a transmission mode or a reception mode. In a case wherein transmission of a signal is to be performed, in step S11, determination is made that the current mode is the transmission mode, and the processing proceeds to step S12.

Figure 23:
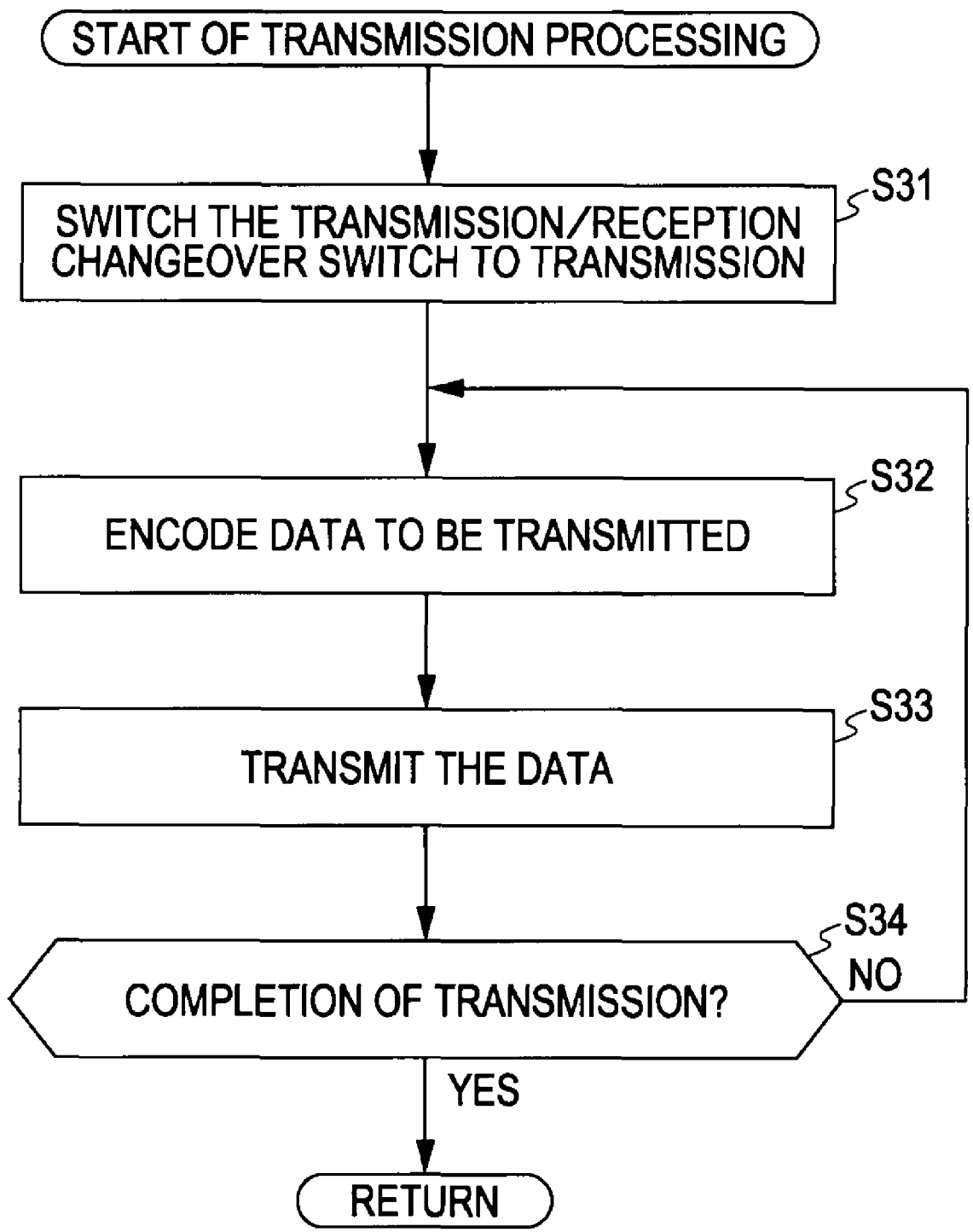
FIG. 23 is a flowchart describing transmission processing.

In step S12, transmission processing is executed, which will be described later with reference to FIG. 23. Now, the details of the transmission processing in step S12 in FIG. 22 will be described with reference to the flowchart in FIG. 23.

In step S31, the signal processing LSI of the functional module 70 changes over the transmission/reception changeover switch 400 so as to output the signal supplied from the transmission unit 401 to the coupling capacitor 342 or 343.

In step S32, the encoder 423 of the transmission unit 401 encodes the data to be transmitted. At this time, for example, the transmission data generated by the signal processing LSI is subjected to processing, such as interleave, addition of an error correction code, encoding of code multiple, diffusion encoding, or the like, following which this is converted into IQ symbols, and the IQ symbols thereof are output with phase difference of 90 degrees.

In step S33, the adder 422 performs addition of the IQ symbols supplied from the encoder 423, the filter 421 subjects the signal output through the processing of the adder 422 to filtering processing for suppressing harmonic signals, and the signal is transmitted.

In step S34, the signal processing LSI determines whether or not the transmission has been completed. In a case wherein there is data to be transmitted, determination is made in step S34 that the transmission has not been completed, the processing returns to step S32, where the subsequent processing is repeatedly executed.

On the other hand, in a case wherein determination is made in step S34 that the transmission has been completed, the transmission processing is ended.

Returning to FIG. 22, in a case wherein reception of a signal is to be performed, determination is made in step S11 that the current mode is the reception mode, and the processing proceeds to step S13.

Figure 24:
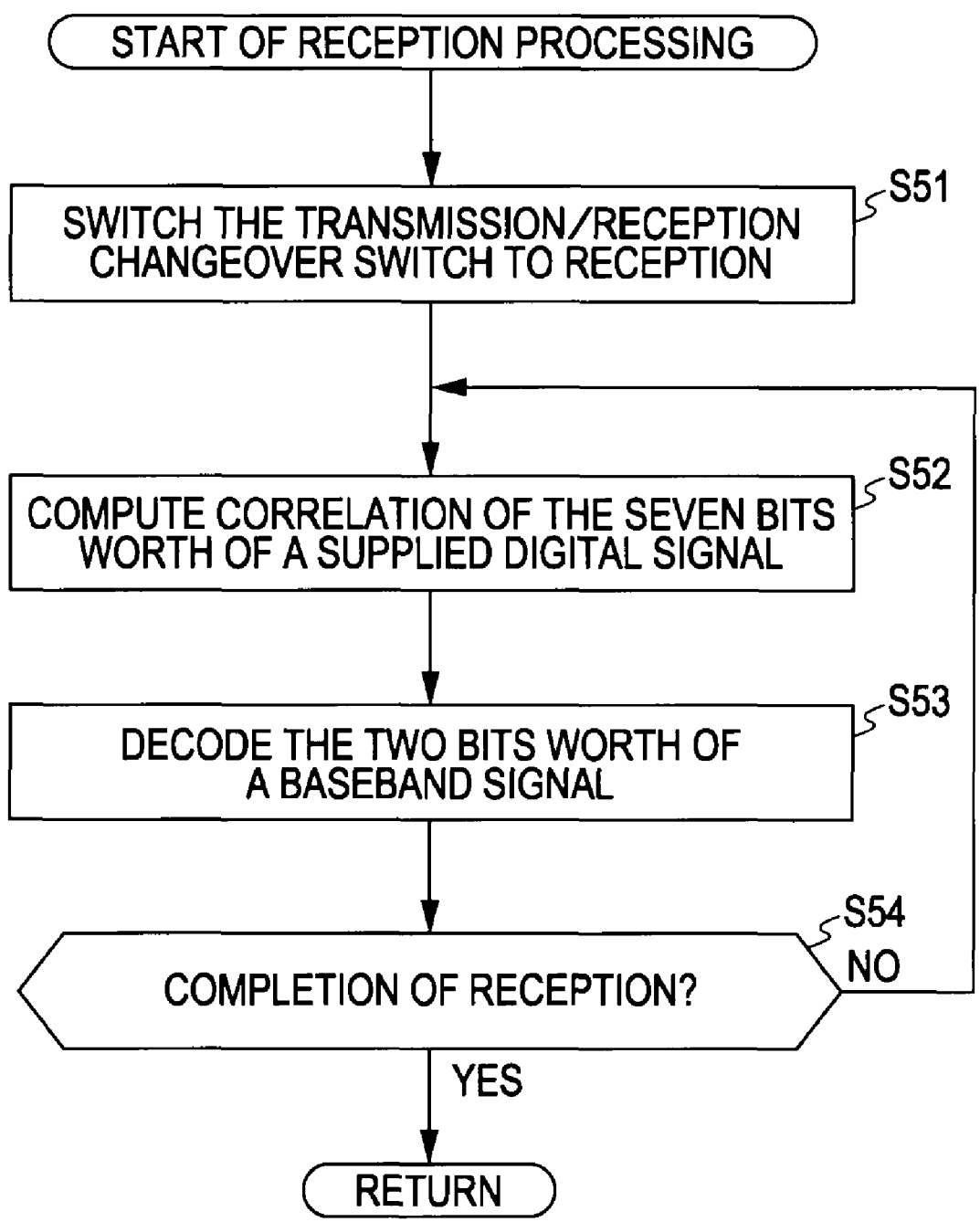
FIG. 24 is a flowchart describing reception processing.

In step S13, reception processing is executed, which will be described later with reference to FIG. 24. Now, the details of the reception processing in step S13 in FIG. 22 will be described with reference to the flowchart in FIG. 24.

In step S51, the signal processing LSI of the functional module 70 changes over the transmission/reception changeover switch 400 so as to output the signal supplied from the coupling capacitor 342 or 343 to the equalizer 402. Thus, the reception unit 403 latches the digital signal supplied from the equalizer 402 at the 7-stage shift register 441 based on the synchronizing signal output from the synchronizing unit 404.

In step S52, the correlation computing unit 442 computes the correlation of the seven bits worth of digital signal latched at the 7-stage shift register 441, determines IQ symbols based on the computation result, and outputs the I and Q signals to the decoder 443.

In step S53, the decoder 443 decodes two bits worth of baseband signal based on the I and Q signals supplied from the correlation computing unit 442, and outputs this to the signal processing LSI as reception data.

In step S54, the signal processing LSI determines whether or not the reception has been completed. In a case wherein there is data to be received, determination is made in step S54 that the reception has not been completed, the processing returns to step S52, where the subsequent processing is repeatedly executed.

On the other hand, in a case wherein determination is made in step S54 that the reception has been completed, the reception processing is ended. Also, the communication processing in FIG. 22 is also ended along with this. The communication processing by the functional module 70 is thus executed.

Figure 25:
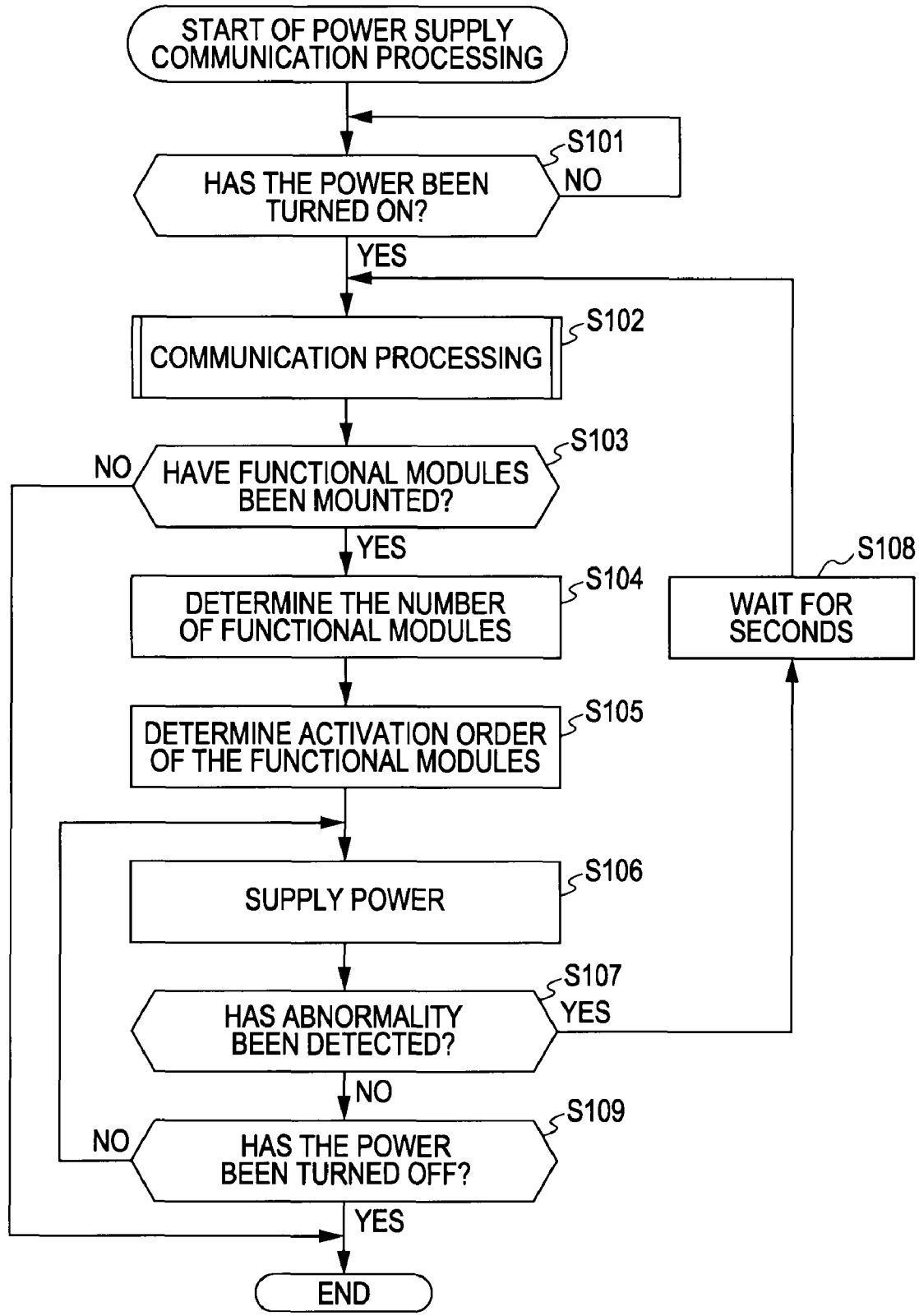
FIG. 25 is a flowchart describing power supply communication processing.

Next, description will be made regarding power supply communication processing in a case wherein with the power transfer apparatus 10, power is transferred to the functional module 70, and communication with the functional module 70 is also performed, with reference to the flowchart in FIG. 25. This processing is executed, for example, when the functional module 70 is mounted in the power transfer apparatus 10. Now, for example, let us say that a communication processing circuit having the same function as the RF signal processing circuit 341 in FIG. 13 is provided in the power source module 55 of the power transfer apparatus 10.

In step S101, the power source module 55 of the power transfer apparatus 10 determines whether or not the power has been turned on, and waits until the power has been turned on. In a case wherein determination is made in step S101 that the power has been turned on, the processing proceeds to step S102.

Figure 26:
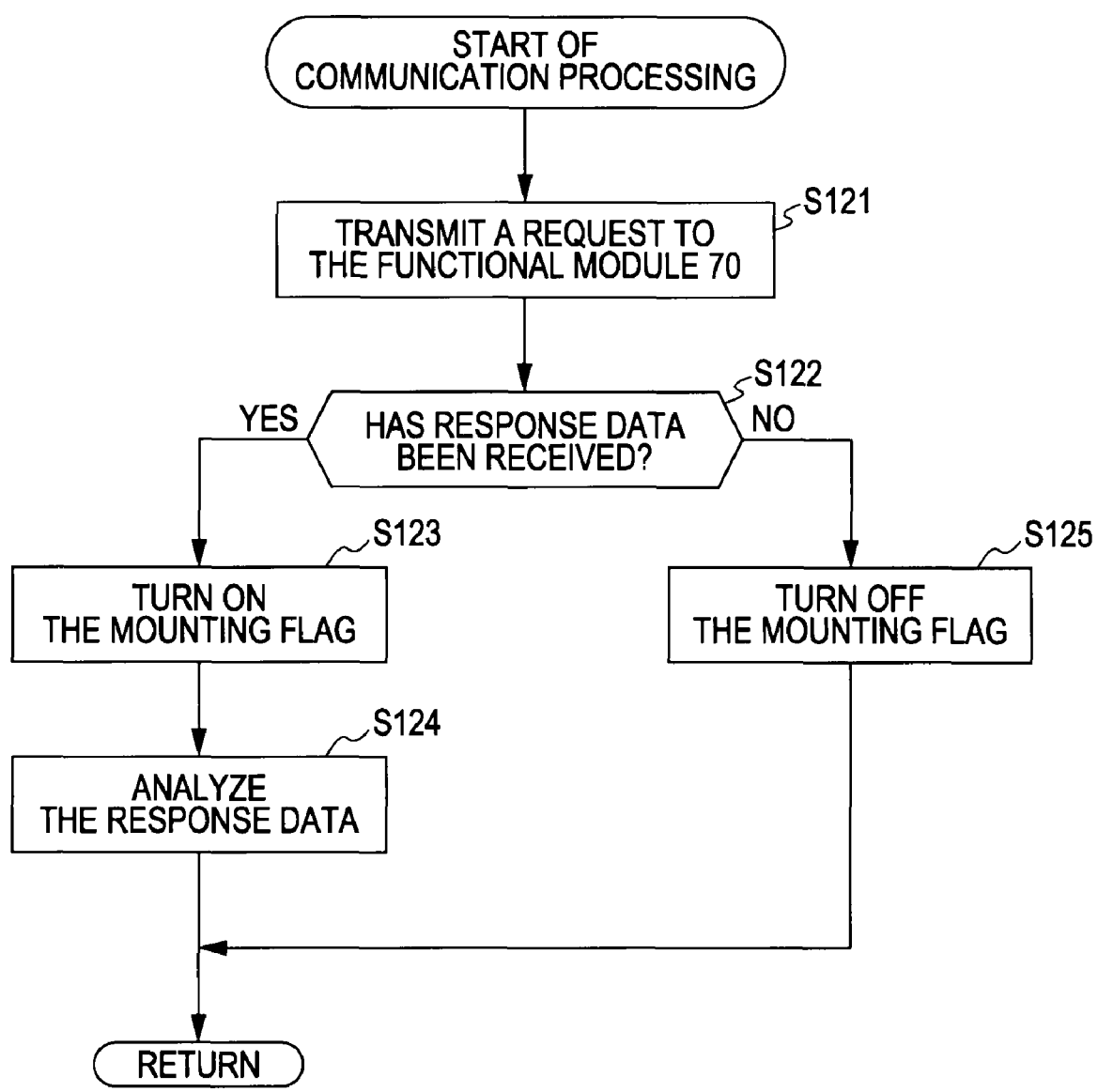
FIG. 26 is a flowchart describing communication processing.

In step S102, the communication processing circuit of the power source module 55 executes communication processing, which will be described later with reference to FIG. 26. Now, the details of the communication processing in step S102 in FIG. 25 will be described with reference to the flowchart in FIG. 26.

In step S121, the communication processing circuit of the power source module 55 transmits a request to the functional module 70. Now, the request mentioned here is for the power source module 55 requesting transmission of the information as to the functional module 70 to obtain information relating to the number of the functional modules 70 currently mounted in the power transfer apparatus 10, power consumption, and so forth.

Note that with regard to transmission of the request in step S121, let us say that the data is encoded and transmitted by the processing of the communication processing circuit of the power source module 55, such as described with reference to FIGS. 16 and 17.

The request transmitted in step S121 is received and analyzed by the RF signal processing circuit 341 of the functional module 70, and the RF signal processing circuit 341 transmits the response information corresponding to the request. Note that the response transmitted from the functional module 70 includes information representing the power consumption of the functional module 70 itself. For example, the response transmitted from the functional module 70-1 includes an ID for determining the functional module 70-1, and information representing the value of the maximum power consumption of the load 302 of the functional module 70-1, and the response transmitted from the functional module 70-2 includes an ID for determining the functional module 70-2, and information representing the value of the maximum power consumption of the load 302 of the functional module 70-2.

In step S122, the communication processing circuit of the power source module 55 determines whether or not the response from the functional module 70 has been received. In a case wherein determination is made in step S122 that the response has been received, the processing proceeds to step S123.

Note that let us say that the response data received from the functional module 70 is decoded by the processing of the communication processing circuit of the power source module 55 such as described with reference to FIGS. 18 through 20, and this data is employed for the subsequent processing.

In step S123, the communication processing circuit of the power source module 55 sets a mounting flag to ON. In step S124, the communication processing circuit of the power source module 55 analyzes the received response, and obtains information relating to the power consumption of the functional module 70, or the like.

Here, the mounting flag is, for example, a flag representing that the functional module 70 is mounted, and in a case wherein the functional module 70 is mounted, the mounting flag is ON, and in a case wherein the functional module 70 is not mounted, the mounting flag is OFF. In a case wherein the multiple functional modules 70 are mounted in the power transfer apparatus 10, the mounting flag is set to ON, and the number of the mounted functional modules 70 is also counted, and the counted value is stored in the memory within the communication processing circuit, or the like. Also, in a case wherein the multiple functional modules 70 are mounted in the power transfer apparatus 10, information relating to the power consumption of the functional module is stored in the memory within the communication processing circuit, or the like in a correlated manner with an ID for determining each of the functional modules, or the like.

On the other hand, in a case wherein determination is made in step S122 that the response has not been received, the processing proceeds to step S125.

In step S125, the communication processing circuit of the power source module 55 sets the mounting flag to OFF.

Returning to FIG. 25, after the processing in step S102, the processing proceeds to step S103, where the communication processing circuit of the power source module 55 determines whether or not the functional module 70 is mounted. In a case wherein the mounting flag is set to ON in step S102 (the communication processing described with reference to FIG. 26), determination is made in step S103 that the functional module 70 is mounted, and the processing proceeds to step S104.

In step S104, the communication processing circuit of the power source module 55 determines the number of the mounted functional modules 70 based on the information obtained by the processing in step S102.

In step S105, the communication processing circuit of the power source module 55 determines the activation order of the mounted functional modules 70 based on the information obtained by the processing in step S102.

In a case wherein determination is made by the processing in step S104 that the multiple functional modules are mounted, the activation order of the multiple functional modules is determined in step S105. Thus, the activation order is set so as to activate the function modules in descending order of power consumption.

In step S106, the communication processing circuit of the power source module 55 supplies power to the functional module 70 in accordance with the activation order determined in the processing in step S105. At this time, for example, power is supplied by the metal plates 51 and 52 of the casing 50, and also a signal for instructing activation of a particular functional module corresponding to the activation order is transmitted from the metal plates 51 and 52 of the casing 50. The signal for instructing activation of a particular functional module corresponding to the activation order, which is transmitted this time, is transferred as described above with reference to FIG. 14, and is received by the functional module which should receive the instruction thereof. Subsequently, the functional module which received the signal for instructing activation of a particular functional module activates the power conversion circuit 301 to start consumption of power by the load 302.

In step S107, the communication processing circuit of the power source module 55 determines whether or not abnormality has been detected. Now, let us say that detection is made whether or not each of the mounted functional modules is operating normally (abnormally). Detection of abnormality may be performed based on information to be periodically transmitted/received to/from the RF signal processing circuit 341 of the functional module 70, or change in the power consumption of the functional module 70, or the like.

In a case wherein determination is made in step S107 that abnormality has been detected, the processing proceeds to step S108, where the processing is in a standby state for several seconds. Subsequently, the processing proceeds to step S102, where the subsequent processing is repeatedly executed.

In a case wherein determination is made in step S107 that abnormality has not been detected, the processing proceeds to step S109, where determination is made whether or not the power has been turned off.

In a case wherein determination is made in step S109 that the power has not been turned off, the processing returns to step S106. In a case wherein determination is made in step S109 that the power has been turned off, the processing ends.

Note that in a case wherein determination is made in step S103 that the functional module 70 is not mounted, the processing in steps S104 through S109 is skipped, and the processing ends.

The power supply communication processing is thus performed. Thus, power can be supplied to the mounted functional module, and communication from the power transfer apparatus to the mounted functional module, or communication between the mounted functional modules can also be performed.

For example, in a case wherein the power transfer apparatus 10 and functional module 70 according to an embodiment of the present invention has been applied to an image processing apparatus for converting an input image into a high-quality image to output this, an arrangement may be made wherein once the detachable functional module 70-1 is mounted in the power transfer apparatus 10, power is automatically supplied to the functional module 70-1, communication of pertinent information is performed, noise of an input image is removed by the signal processing LSI of the functional module 70-1, and the image converted into a high-quality image is output. Subsequently, further, once the functional module 70-2 is mounted in the power transfer apparatus 10, power is also automatically supplied to the functional module 70-2, communication of pertinent information is performed, pixel interpolation processing of an input image is performed by the signal processing LSI of the functional module 70-2, and the image converted into a further high-quality image is output.

Description has been made here regarding an example of the case wherein a signal is transferred to the functional module 70 along with power by the power transfer apparatus 10, but an arrangement may be made wherein only a signal is transferred to the functional module 70.

For example, an arrangement may be made wherein power is supplied to the functional module 70 by cable, battery, or the like, only wireless communication with the solution 54 as a medium is performed within the casing 50 of the power transfer apparatus 10. That is to say, an arrangement may be made wherein with the power transfer apparatus 10 according to an embodiment of the present invention, transfer of power to the functional module 70 is performed with another route, communication with the casing 50 of the functional module 70, or communication between the multiple functional modules 70, or the like, is performed by the above-described route.

That is to say, the power transfer apparatus 10 according to an embodiment of the present invention may be employed as a communication apparatus for performing wireless communication with the solution 54 as a medium instead of an apparatus for transferring power. Accordingly, the power transfer apparatus 10 according to an embodiment of the present invention may be restated as a communication apparatus.

In this case, wireless communication is performed with solution as a medium, so carrier waves do not have to be employed, and further, if power is supplied by another route, further the encoding processing of the transmission unit 401, and the decoding processing of the reception unit 403 also does not have to be performed.

If power is supplied by another route, for example, a baseband digital signal (pulses) may be transmitted/received directly. Also, as described above, a signal is transferred to the functional modules disposed in the nearest in order, whereby interference can be prevented as well.

Also, the communication apparatus (power transfer apparatus 10) according to an embodiment of the present invention solves the multipath problem, which has been a source of trouble with wireless communication performed within the casing of an electronic device, for example.

Heretofore, for example, there has been a problem wherein if high-speed large-capacity communication, of which video signals are representative, is performed in a constant multipath environment, with generally-performed decoding, signals may be lost due to DC offset or the like caused by multipath, and accordingly, communication is not performed. The constant multipath mentioned here is caused in an environment wherein a transmitter and receiver which perform wireless communication are covered with metal, and examples of such an environment include a case wherein wireless communication is performed within an electronic device.

Specifically, there is a problem wherein if wireless communication is performed within metal-covered narrow space such as the inside of the casing of an electronic device, a transmission signal is reflected several times within the casing such as an electronic device or the like, and consequently, the waveform of a reception signal is disrupted. Therefore, heretofore, it has been difficult to employ a configuration wherein components (functional modules, etc.) communicate wirelessly within the casing of an electronic device or the like.

For example, description will be made regarding how a constant multipath signal is changed in a case wherein wireless communication employing ASK (Amplitude Shift Keying) modulation is performed within the casing of an electronic device.

White noise (e.g., thermal noise) or colored noise (e.g., noise emitted from another LSI) existing within the casing, or a signal reflected or diffracted at the wall face or board within the casing is added to radio waves emitted within the casing. Accordingly, upon receiving such radio waves, the transmitted original signal waveform is not reproduced, rather, a distorted waveform is obtained instead. Particularly, deterioration due to reflected waves input to a reception point with the same magnitude as the transmitted signal power causes a serious problem.

The reflected waves have the same waveform as the signal to be received, but this can be regarded as a signal of which the route differs from that of the signal to be received (accordingly, time for transfer is shifted). Upon the reflected waves thereof being superimposed on the original signal to be received at a reception point, the waveform is distorted, and interference is caused, which makes it difficult to perform decoding.

Figure 27A:
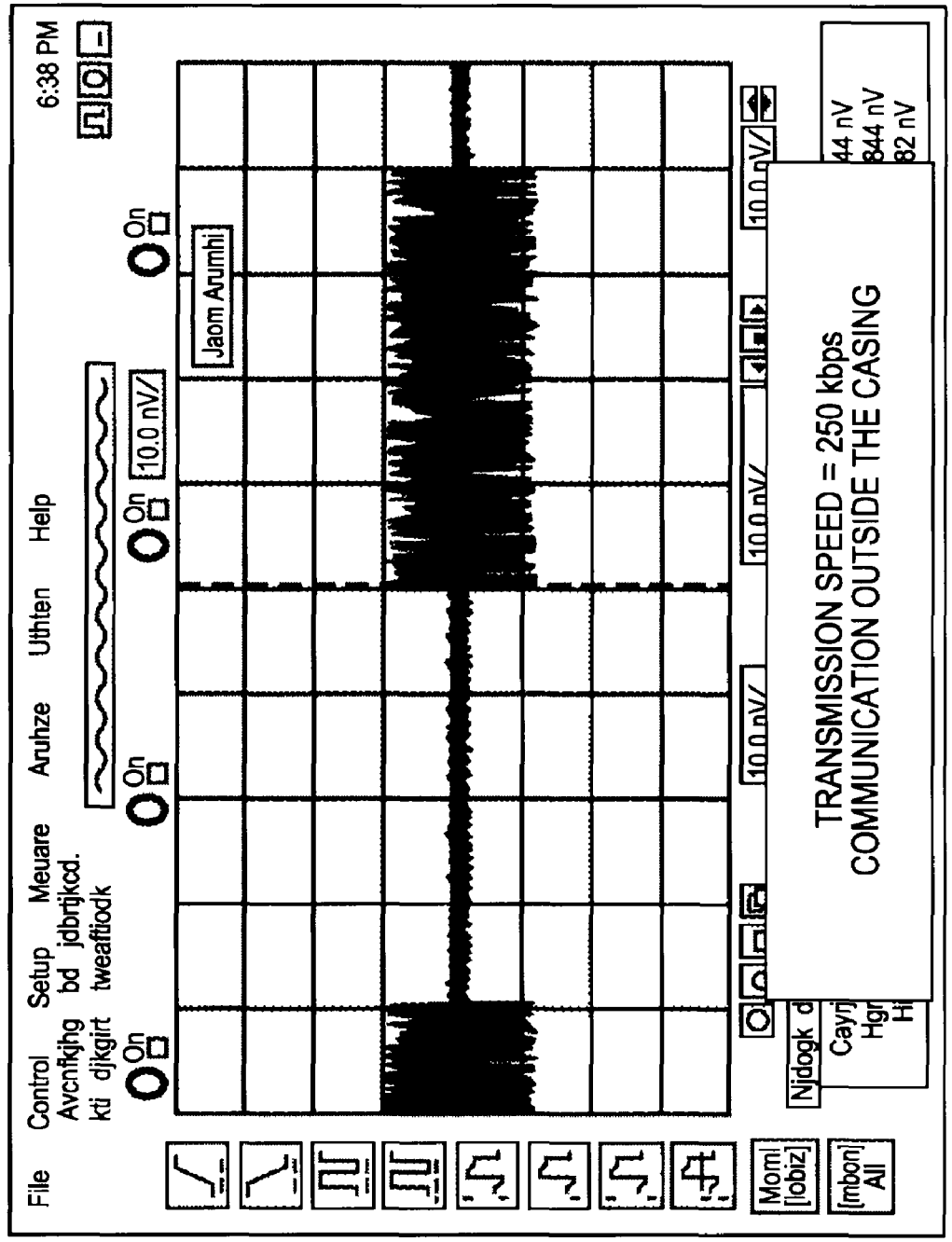
FIGS. 27A and 27B are diagrams illustrating reception waveforms in the case of emitting radio waves subjected to ASK modulation within and outside the casing.

FIGS. 27A through 30B illustrate a reception waveform in a case wherein radio waves subjected to ASK modulation are emitted within or outside the casing, which has been observed with an oscilloscope. FIGS. 27A and 27B illustrate a reception waveform at the outside of the casing, and a reception waveform within the casing, respectively, in a case wherein the transfer speed of the signal by means of radio waves is 250 kbps. FIGS. 28A and 28B illustrate a reception waveform at the outside of the casing, and a reception waveform within the casing, respectively, in a case wherein the transfer speed of the signal by means of radio waves is 500 kbps. Similarly, FIGS. 29A and 29B, and FIGS. 30A and 30B correspond to a case wherein the transfer speed of the signal by means of radio waves is 1 Mbps, and a case wherein the transfer speed of the signal by means of radio waves is 2 Mbps, respectively.

The ASK modulation method is a modulation method which represents "1" or "0" of the baseband signal depending on whether there is a signal, so the faster the transfer speed is, the higher the possibility is that a signal section to be originally determined (decoded) as "0" is determined as "1" by the waveform being disrupted with reflected waves superimposing on that section.

Figure 27B:
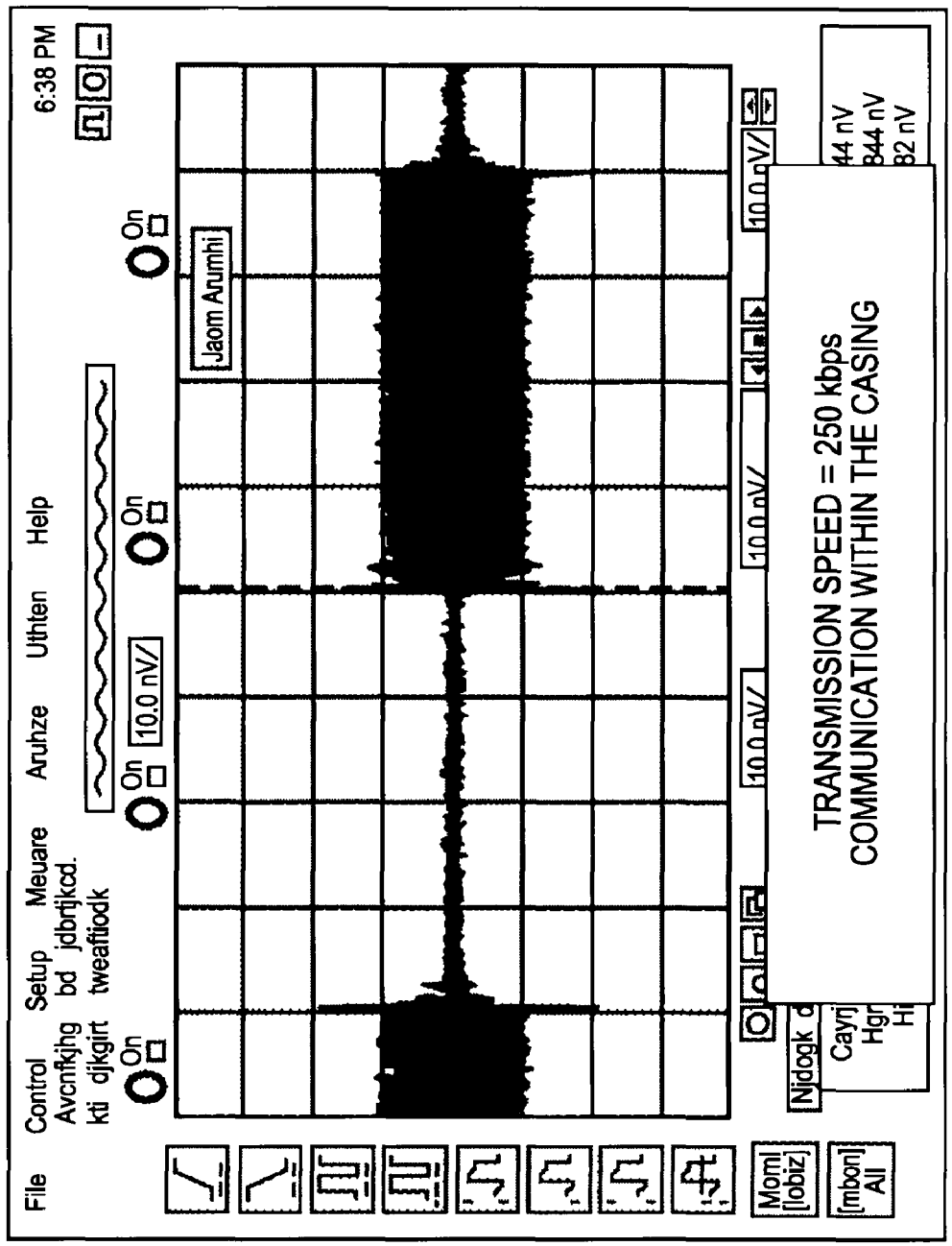
Figure 28A:
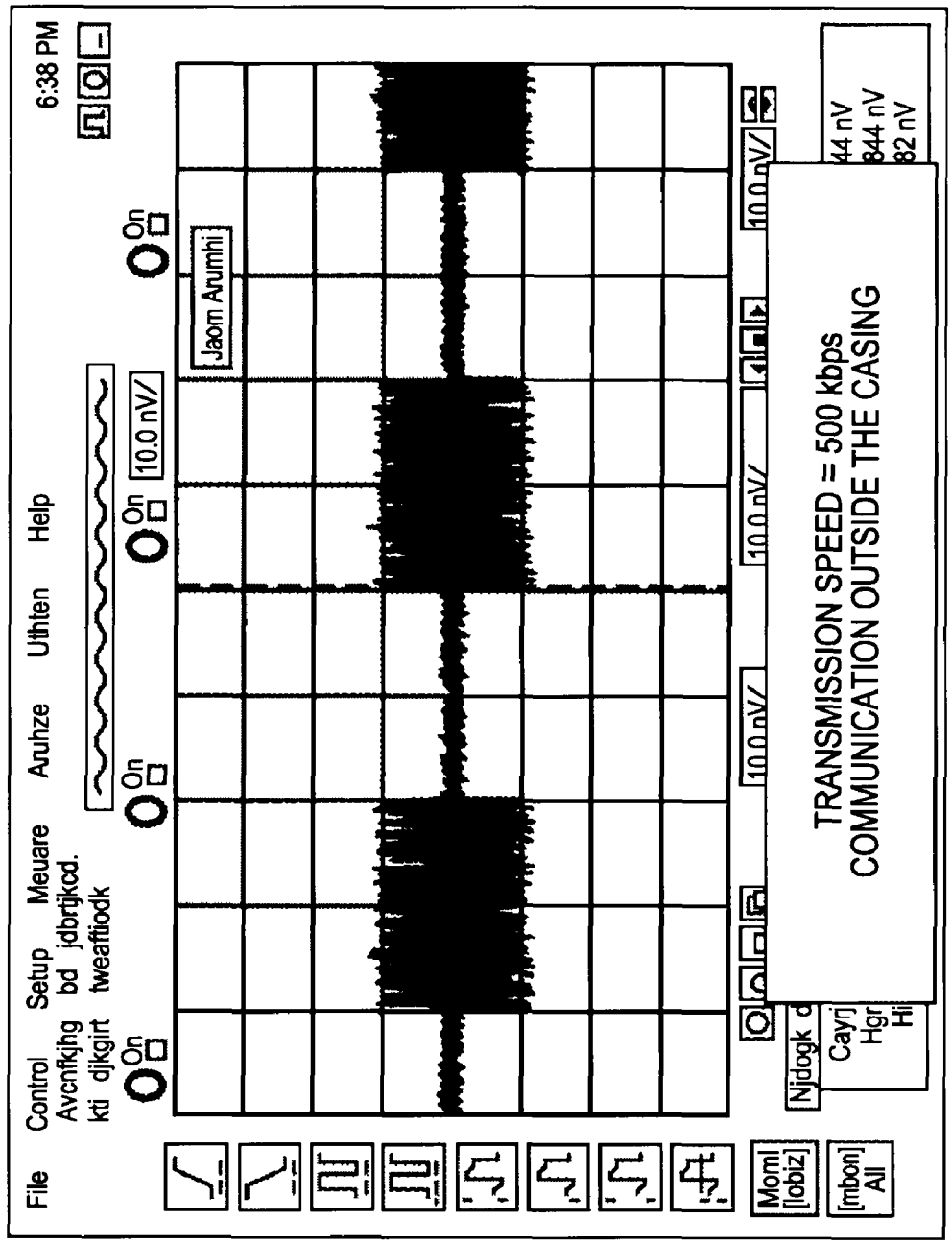
FIGS. 28A and 28B are diagrams illustrating reception waveforms in the case of emitting radio waves subjected to ASK modulation within and outside the casing.
Figure 28B:
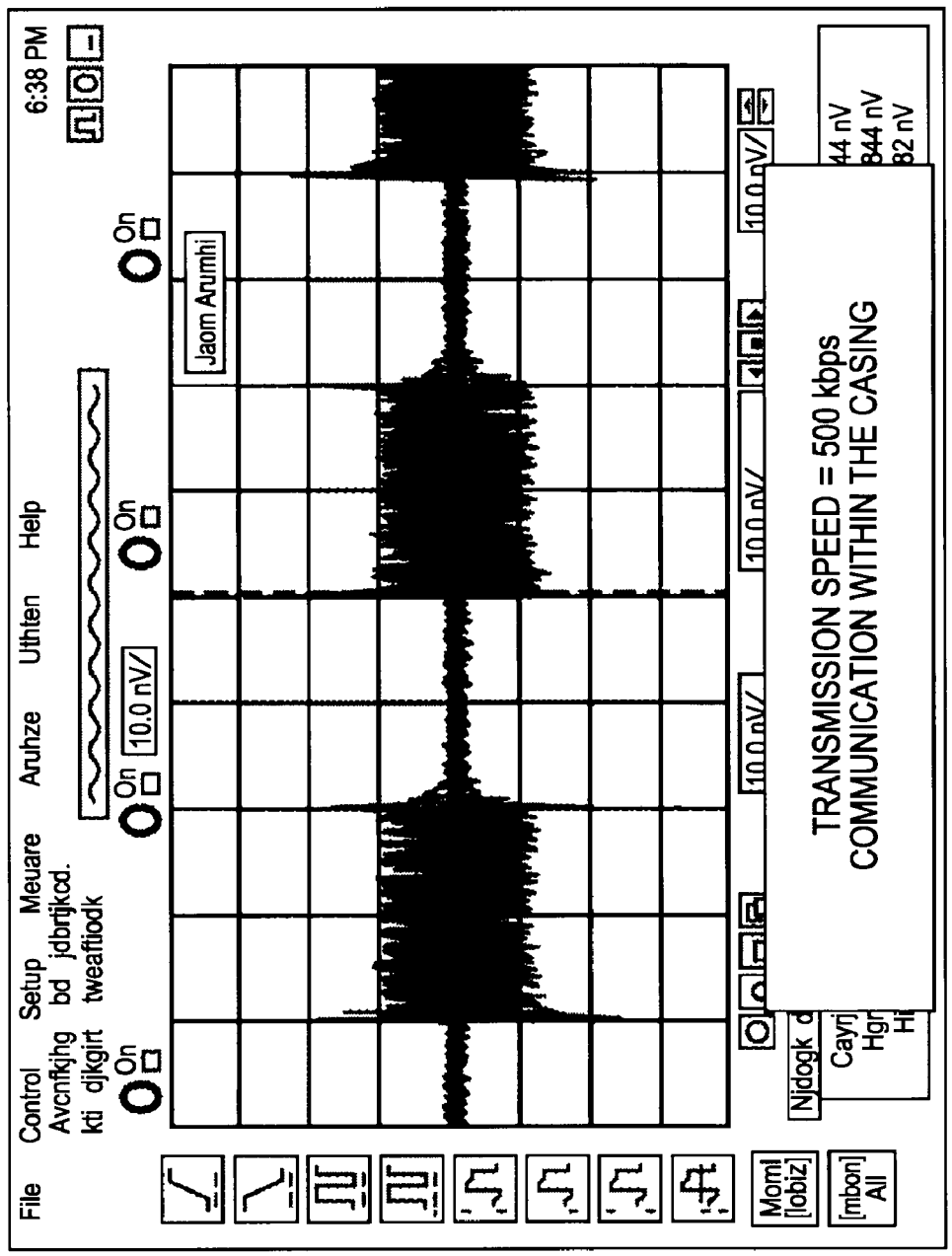
Figure 29A:
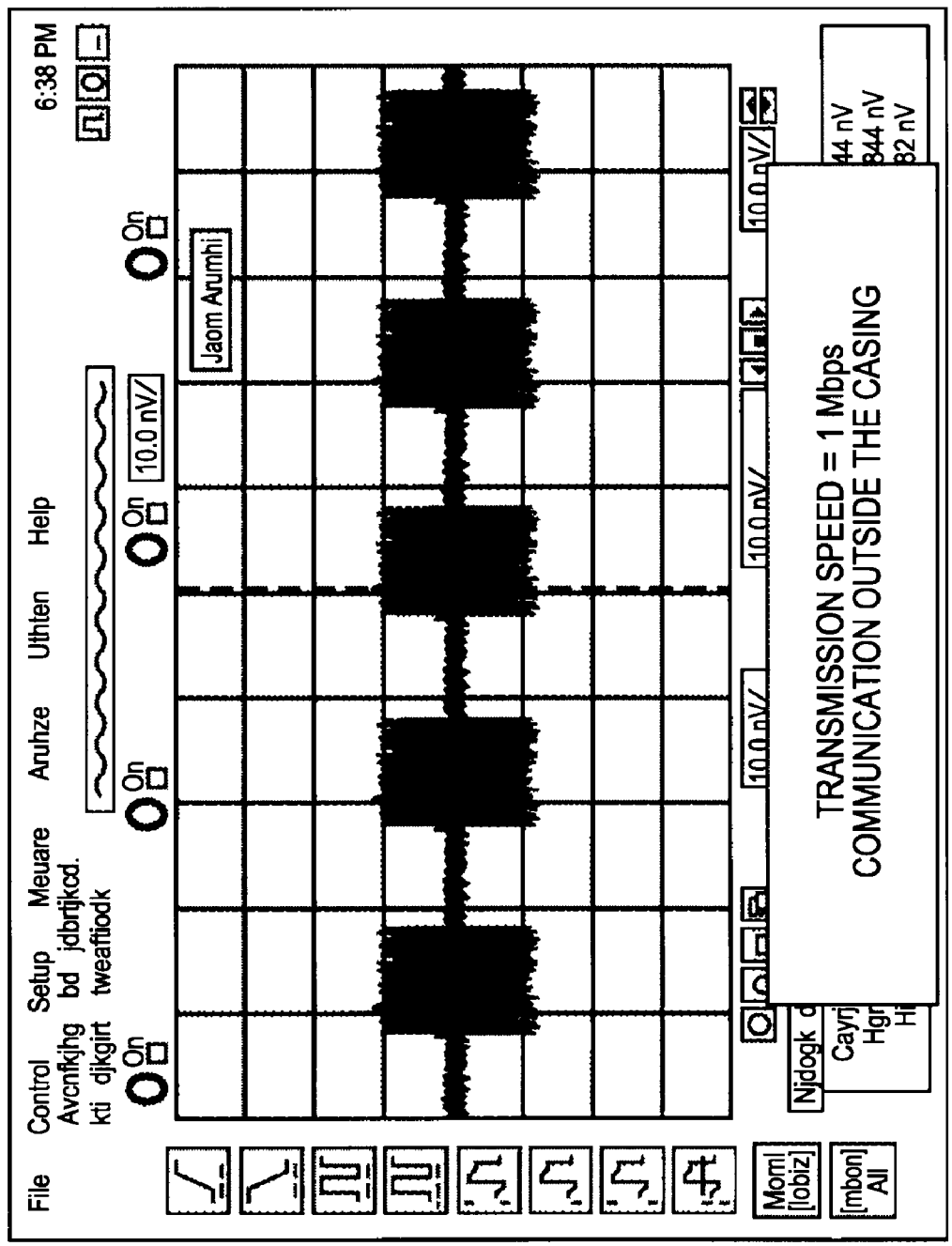
FIGS. 29A and 29B are diagrams illustrating reception waveforms in the case of emitting radio waves subjected to ASK modulation within and outside the casing.
Figure 29B:
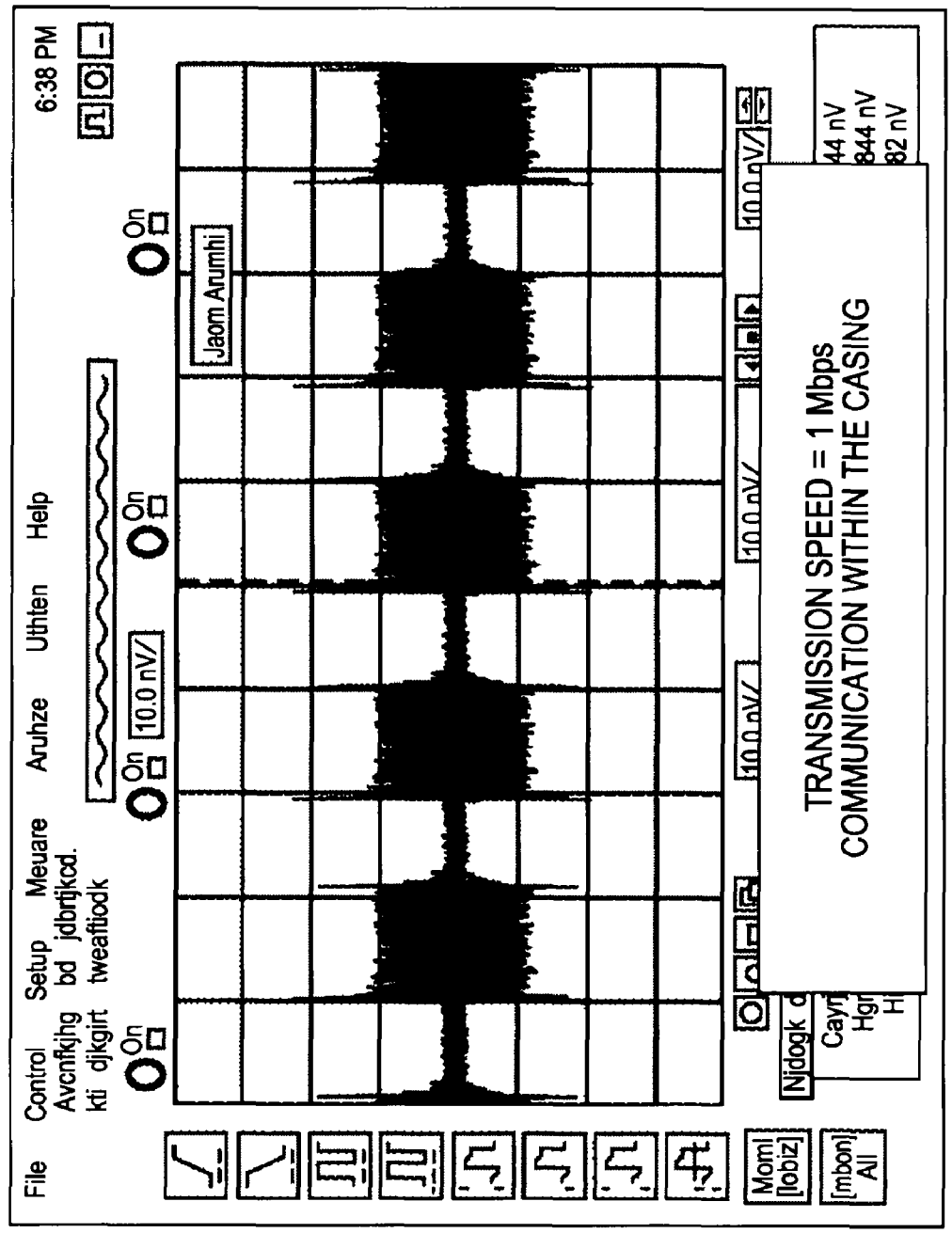
Figure 30A:
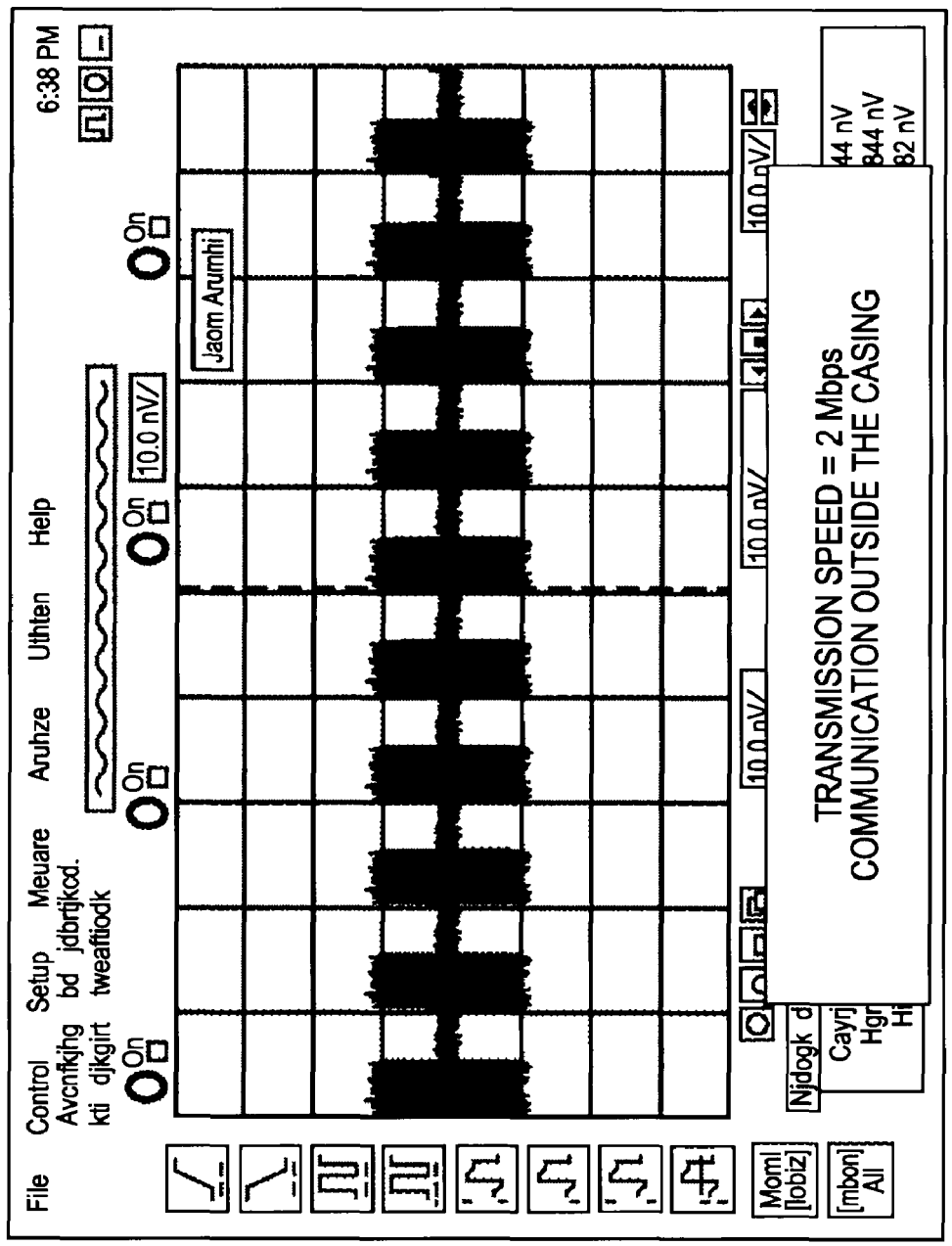
FIGS. 30A and 30B are diagrams illustrating reception waveforms in the case of emitting radio waves subjected to ASK modulation within and outside the casing.
Figure 30B:
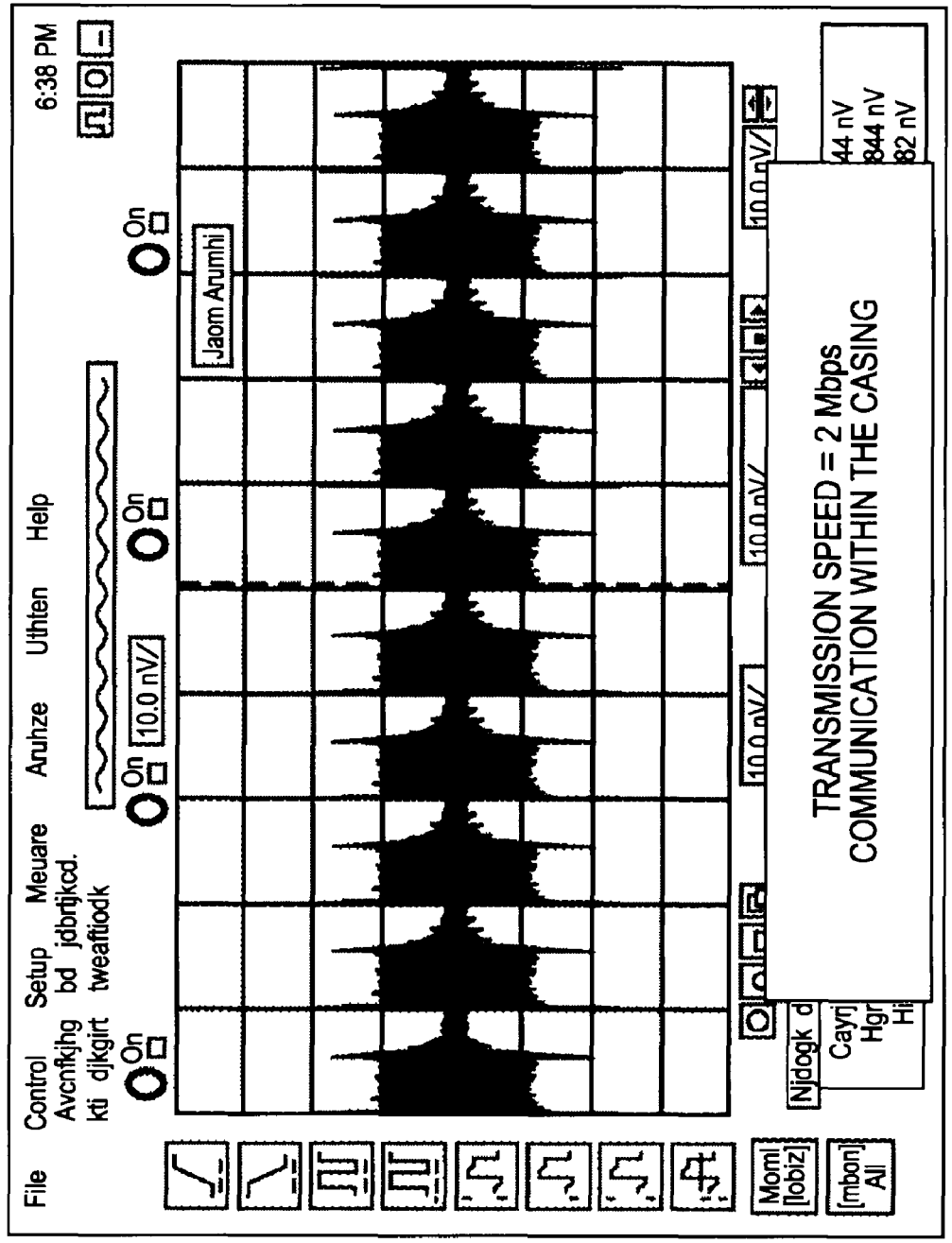

For example, upon the reception waveform illustrated in FIG. 27A or 28A being distorted by the reflected waves within the casing, the reception waveform is changed to a waveform illustrated in FIG. 27B or FIG. 28B, but according to the reception waveform in FIG. 27B or 28B, a signal section corresponding to "0" of the baseband signal, and a signal section corresponding to "1" of the baseband signal can be generally clearly distinguished. However, upon the reception waveform illustrated in FIG. 29A being distorted by the reflected waves within the casing, the waveform is changed to a waveform illustrated in FIG. 29B. The reception waveform in FIG. 29B makes it difficult to clearly distinguish a signal section corresponding to "0" of the baseband signal, and a signal section corresponding to "1" of the baseband signal. Further, upon the reception waveform illustrated in FIG. 30A being distorted by the reflected waves within the casing, the waveform is changed to a waveform illustrated in FIG. 30B. The reception waveform in FIG. 30B makes it difficult to clearly distinguish a signal section corresponding to "0" of the baseband signal, and a signal section corresponding to "1" of the baseband signal.

Thus, influence of the reflected waves with the reception waveform greatly differs depending on the transfer speed of the signal, and accordingly, the faster the transfer speed of the signal is, the greater communication quality is deteriorated by the reflected waves.

Figure 31A:
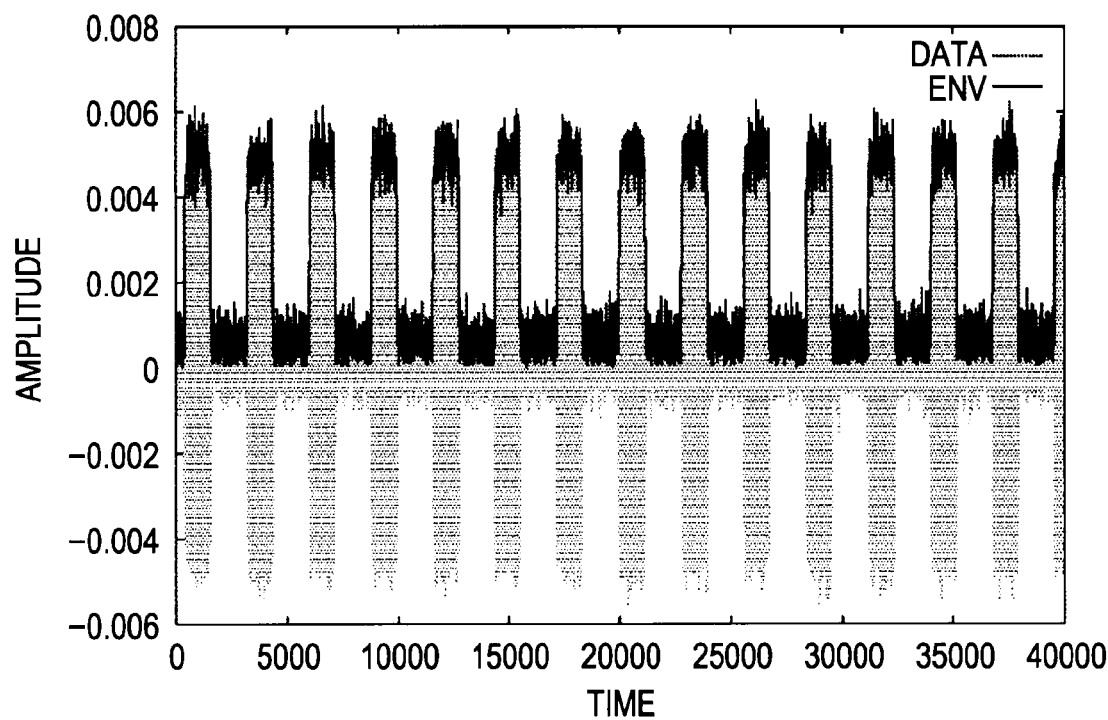
FIGS. 31A and 31B are diagrams illustrating a transmission waveform and reception waveform in the case of emitting radio waves subjected to ASK modulation at predetermined transfer speed.
Figure 31B:
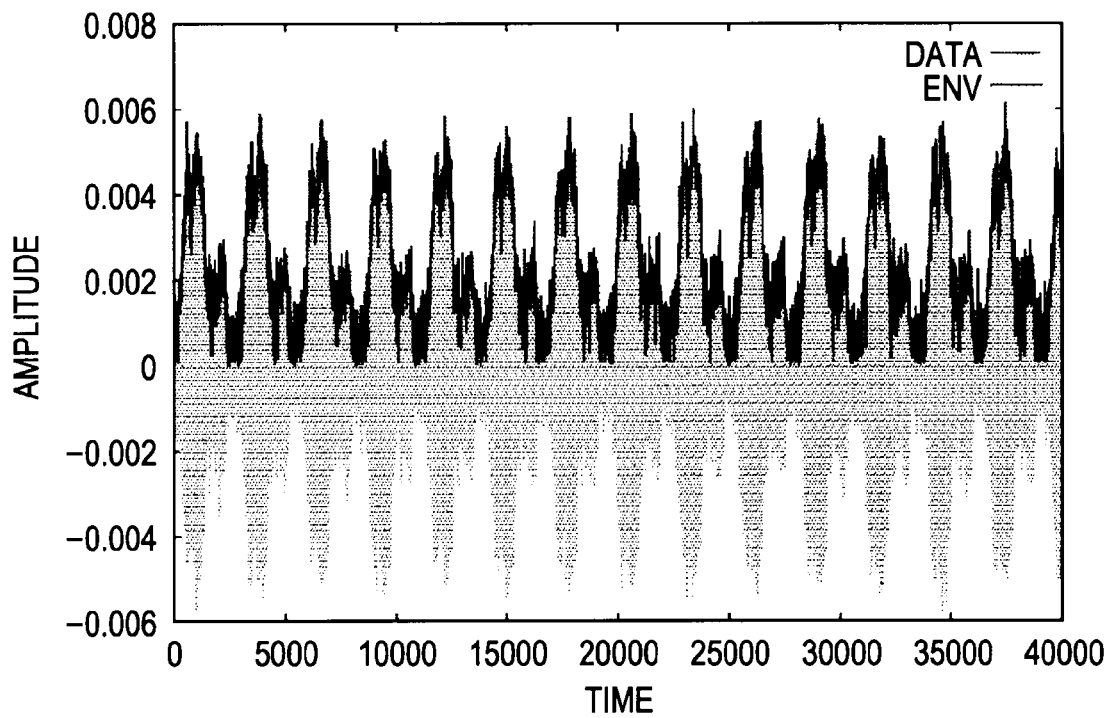

FIG. 31A illustrates a reception waveform in a case wherein radio waves subjected to ASK modulation are emitted at a predetermined transfer speed, which has been observed with an oscilloscope. FIG. 31B illustrates a reception waveform in a case wherein the radio waves illustrated in FIG. 31A are received within the casing, which has been observed with an oscilloscope. The waveform in FIG. 31B is distorted by influence of the reflected waves caused within the casing.

Figure 32A:
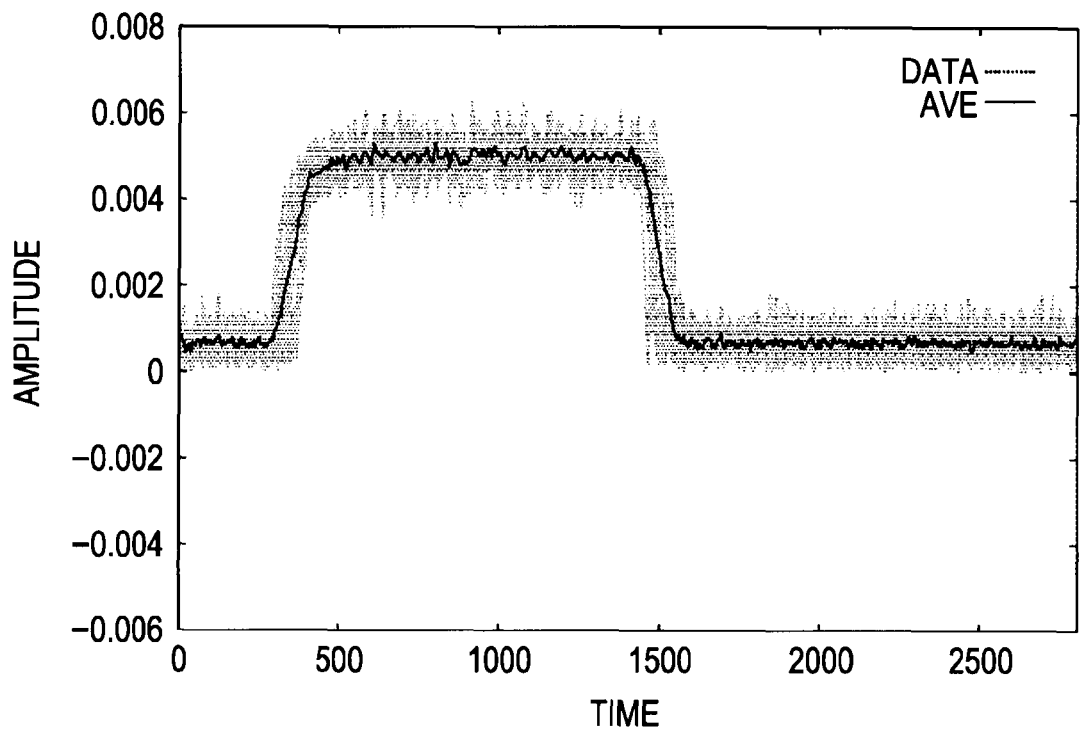
FIGS. 32A and 32B are diagrams arranging and superimposing the phases of envelope curves of 14 waveforms on a waveform within a predetermined time interval regarding the waveforms in FIGS. 31A and 31B.

FIG. 32A is a diagram showing a waveform within a predetermined time interval regarding the transmission waveform illustrated in FIG. 31A with the phases of envelope curves of 14 waveforms aligned and overlapped. Also, FIG. 32B is a diagram showing a waveform within the same predetermined time interval as that in FIG. 32A regarding the reception waveform illustrated in FIG. 31B with the phases of envelope curves of 14 waveforms aligned and overlapped.

Figure 32B:
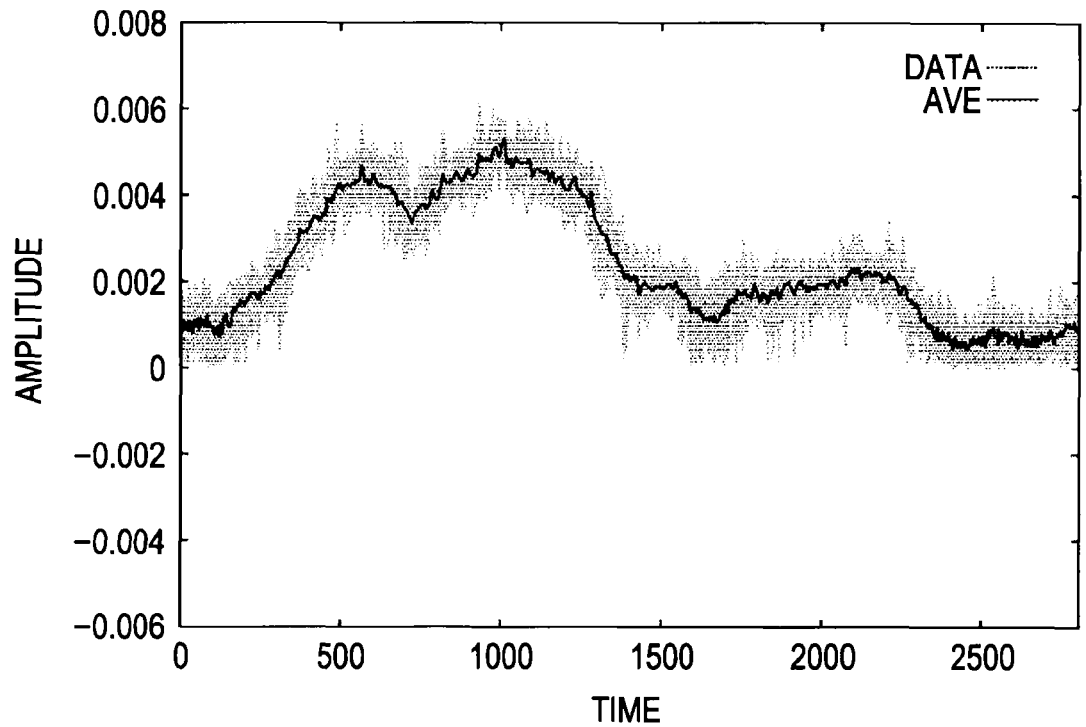

With the waveform illustrated in FIG. 32B, the same amplitude shape as that of the waveform illustrated in FIG. 32A can be viewed. That is to say, it can be found that deterioration in the reception waveform due to the reflected waves caused within the casing is generally constant over time, and a period wherein the reflected waves affect on the reception waveform is short.

Signal waves formed by the radio waves (original signal) to be received, and the reflected waves transferred with a route different from the route of the radio waves thereof being superimposed, are also referred to as multipath waves, and as described above, influence due to the multipath waves causes a serious problem as the speed of the transmission signal increases. Also, as described above, with the related art, deterioration in the reception waveform due to multipath caused within the casing of an electronic device, or the like, is generally constant over time, and a period wherein the multipath waves affect on the reception waveform is short, and accordingly, an environment such as the inside of the casing of an electronic device can be referred to as a constant multipath environment.

In such a constant multipath environment, methods for attempting improvement in communication quality include the following methods.

For example, there can be conceived a method wherein OFDM (Orthogonal Frequency Division Multiplexing) is employed at the time of modulation/demodulation, thereby realizing improvement in communication quality. However, when employing OFDM, it is fast Fourier transform often has to be performed, and consequently, increase in power consumption causes a problem.

Also, for example, there can be conceived a method wherein SS (Spread Spectrum) and rake reception are employed, thereby realizing improvement in communication quality. However, when employing the SS, signal processing of which the speed is higher than a transmission signal has to be performed, and accordingly, this is unsuitable for broadband communication such as transmission of video signals.

Also, for example, there can be conceived a method wherein a multi-antenna is employed, thereby realizing improvement in communication quality. However, in order to obtain the advantage of the multi-antenna, the spacing between the antennas has to be sufficiently separated, and accordingly, for example, in a case wherein a multi-antenna is realized on a board within the casing of an electronic device, placement is restricted, leading to increase in the size of the device, and restriction of design flexibility.

Further, there can be conceived a method wherein a wave absorber is employed, thereby realizing improvement in communication quality. For example, a plate-shaped wave absorber configured of ferrite, urethane, or the like as a material is adhered to the inner wall of the casing as appropriate, or the like, whereby occurrence of reflected waves within the casing can be suppressed.

However, with an arrangement wherein solution is injected in the casing, and wireless communication with the solution thereof as a medium is performed, as with the present invention, occurrence of reflected waves can be suppressed without providing a wave absorber or the like.

This is because the wavelength of radio waves is reduced by the solution, and the size of the casing as to the wavelength is sufficiently great, so the transfer distance of the reflected waves of constant multipath increases, and consequently, the reflected waves are sufficiently attenuated. Also, this is because the solution itself has a nature of wave absorption though small, so the longer the transfer distance is, the greater the attenuation of radio waves is, and consequently, the reflected waves of long-distance constant multipath are greatly attenuated as compared to the radio waves to be received at the original route, and influence on the reception waveform is reduced.

Also, with the communication apparatus according to an embodiment, the modulation methods such as OFDM, SS, or the like do not have to be employed, whereby broadband wireless communication can also be realized at low costs.

Therefore, according to the present invention, for example, there is no restriction such as wiring for communication of the functional module, or the like, and accordingly, the mounting position of the functional module can be adjusted flexibly. As a result thereof, improvement in design flexibility, suppression of increase in manufacturing costs, and elimination of multipath influence with broadband wireless communication can be realized.

Note that the respective steps according to the present Specification include not only processing performed in time sequence in accordance with the described sequence but also processing not necessarily performed in time sequence but performed in parallel or individually.

It should be understood by those skilled in the art that various modifications, combinations, sub-combinations and alterations may occur depending on design requirements and other factors insofar as they are within the scope of the appended claims or the equivalents thereof.

What is claimed is:

1. A power transfer apparatus, comprising:
   a casing into which liquid is injected;
   two metal plates disposed so as to come into contact with said liquid within said casing; and
   a power source configured to emit a current into said liquid with each of said two metal plates as an electrode;
   wherein power is supplied from said power source to a functional module including two electrodes to be mounted within said casing through said liquid such that each of the two electrodes of the functional module comes into contact with said liquid;
   and wherein said functional module is mounted such that said liquid can flow from one of said two metal plates to the other.

2. The power transfer apparatus according to claim 1, wherein a plurality of said functional modules are detachably mounted.

3. The power transfer apparatus according to claim 1, wherein said power source emits a DC current into said liquid.

4. The power transfer apparatus according to claim 1, wherein said power source emits an AC current into said liquid.

5. The power transfer apparatus according to claim 1, wherein the functional module includes an electronic functional module.

6. A functional module for receiving power supplied from a power transfer apparatus including
   a casing into which liquid is injected,
   two metal plates disposed so as to come into contact with said liquid within said casing, and
   a power source configured to emit a current into said liquid with each of said two metal plates as a first electrode,
   said functional module comprising:
   second electrodes disposed on the surface and rear face of a plate-shaped main unit respectively;
   wherein the surface area of said main unit is smaller than the cross-sectional area of said casing.

7. The functional module according to claim 6, wherein sealing members are provided, which cover the second electrodes disposed on the surface and rear face of said main unit.

8. The functional module according to claim 6, further comprising:
   electric load configured to execute predetermined processing in response to said power supply; and
   a power conversion circuit configured to supply power to said electric load in a stable manner according to the power consumption of said electric load.

9. The functional module according to claim 8, wherein a plurality of the second electrodes are disposed on each of the surface and rear face of said main unit;
   and wherein said electric load and said electric conversion circuit are provided, which correspond to each of said plurality of second electrodes.

10. The functional module according to claim 8, wherein said power conversion circuit includes a diode bridge for rectifying a current supplied from said second electrodes disposed on the surface and rear face of said main unit.

11. The functional module according to claim 6, wherein said second electrodes disposed on the surface and rear face of said main unit have an area corresponding to the volume of said liquid.

12. The functional module according to claim 6, wherein the functional module includes an electronic functional module.

* * * * *